(12) United States Patent
Oh

(10) Patent No.: US 8,843,692 B2
(45) Date of Patent: Sep. 23, 2014

(54) SYSTEM OF INTERCONNECTED NONVOLATILE MEMORIES HAVING AUTOMATIC STATUS PACKET

(75) Inventor: HakJune Oh, Ottawa (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 861 days.

(21) Appl. No.: 13/048,154

(22) Filed: Mar. 15, 2011

(65) Prior Publication Data

US 2011/0264846 A1    Oct. 27, 2011

Related U.S. Application Data

(60) Provisional application No. 61/328,388, filed on Apr. 27, 2010.

(51) Int. Cl.
*G06F 12/00* (2006.01)
*G11C 7/10* (2006.01)
*G11C 16/10* (2006.01)

(52) U.S. Cl.
CPC .............. *G11C 16/10* (2013.01); *G11C 7/1063* (2013.01); *G11C 7/1051* (2013.01)
USPC .......................................... 711/103; 365/191

(58) Field of Classification Search
None
See application file for complete search history.

(56) References Cited

U.S. PATENT DOCUMENTS

| | | | |
|---|---|---|---|
| 5,430,859 A | 7/1995 | Norman et al. | |
| 5,777,345 A | 7/1998 | Loder et al. | |
| 5,778,419 A | 7/1998 | Hansen et al. | |
| 5,806,070 A | 9/1998 | Norman et al. | |
| 6,072,804 A | 6/2000 | Beyers, Jr. | |
| 6,148,363 A | 11/2000 | Lofgren et al. | |
| 6,381,223 B1 | 4/2002 | Olpe | |
| 6,525,952 B2 * | 2/2003 | Araki et al. | 365/45 |
| 6,657,899 B2 | 12/2003 | Roohparvar | |
| 6,658,509 B1 | 12/2003 | Bonella et al. | |
| 6,715,044 B2 | 3/2004 | Lofgren et al. | |
| 6,888,733 B2 | 5/2005 | Jang et al. | |
| 6,900,528 B2 | 5/2005 | Mess et al. | |
| 7,061,804 B2 | 6/2006 | Chun et al. | |
| 7,093,076 B2 | 8/2006 | Kyung | |
| 7,102,905 B2 | 9/2006 | Funaba et al. | |
| 7,130,958 B2 | 10/2006 | Chou et al. | |
| 7,142,624 B2 | 11/2006 | Cranford, Jr. et al. | |
| 7,168,027 B2 | 1/2007 | Lee et al. | |
| 7,173,340 B2 | 2/2007 | Zhou et al. | |
| 7,184,360 B2 | 2/2007 | Gregorius et al. | |
| 7,221,613 B2 | 5/2007 | Pelley et al. | |
| 7,242,635 B2 | 7/2007 | Okuda | |
| 7,282,791 B2 | 10/2007 | Funaba et al. | |
| 7,298,032 B2 | 11/2007 | Kim et al. | |

(Continued)

OTHER PUBLICATIONS

IEEE Standard for High-Bandwidth Memory Interface Based on Scalable Coherent Interface (SCI) Signaling Technology (RamLink) (1596.4-1996.pdf).

(Continued)

*Primary Examiner* — Kaushikkumar Patel

(57) ABSTRACT

An interconnection arrangement of nonvolatile memory devices is disclosed. In the arrangement, a plurality of memory devices are series-connected. A status of at least one of the plurality of memory devices is provided. The status includes "ready", "busy". The memory devices includes nonvolatile memories, such as, for example, flash memories.

18 Claims, 14 Drawing Sheets

(56) References Cited

U.S. PATENT DOCUMENTS

| | | |
|---|---|---|
| 7,308,524 B2 | 12/2007 | Grundy et al. |
| 7,309,923 B2 | 12/2007 | Kee |
| 7,342,816 B2 | 3/2008 | Bartley et al. |
| 7,515,471 B2 | 4/2009 | Oh et al. |
| 7,565,469 B2 * | 7/2009 | Mylly et al. .................. 710/105 |
| 7,567,471 B2 | 7/2009 | Eilert et al. |
| 7,603,534 B2 | 10/2009 | Roohparvar |
| 7,650,459 B2 | 1/2010 | Eilert et al. |
| 7,652,922 B2 | 1/2010 | Kim et al. |
| 7,688,652 B2 | 3/2010 | Oh |
| 2004/0003168 A1 | 1/2004 | Kim et al. |
| 2004/0148482 A1 | 7/2004 | Grundy et al. |
| 2005/0268025 A1 | 12/2005 | Smith et al. |
| 2006/0031593 A1 | 2/2006 | Sinclair |
| 2007/0076502 A1 | 4/2007 | Pyeon et al. |
| 2007/0109833 A1 | 5/2007 | Pyeon et al. |
| 2007/0143677 A1 | 6/2007 | Pyeon et al. |
| 2007/0233917 A1 | 10/2007 | Pyeon et al. |
| 2007/0234071 A1 | 10/2007 | Pyeon |
| 2007/0257340 A1 | 11/2007 | Briggs et al. |
| 2007/0286009 A1 | 12/2007 | Norman |
| 2008/0080492 A1 | 4/2008 | Pyeon et al. |
| 2008/0201548 A1 * | 8/2008 | Przybylski et al. ............ 711/171 |
| 2008/0225598 A1 | 9/2008 | Jung et al. |
| 2008/0279003 A1 * | 11/2008 | Kim et al. ................ 365/185.05 |
| 2009/0021992 A1 * | 1/2009 | Oh ............................ 365/189.14 |
| 2009/0043946 A1 | 2/2009 | Webb et al. |
| 2009/0073768 A1 * | 3/2009 | Oh et al. .................. 365/185.11 |
| 2009/0103364 A1 | 4/2009 | Pekny et al. |
| 2009/0154284 A1 | 6/2009 | Oh |
| 2009/0161402 A1 | 6/2009 | Oh et al. |
| 2009/0164830 A1 | 6/2009 | Oh |
| 2010/0011174 A1 | 1/2010 | Oh |
| 2010/0034025 A1 | 2/2010 | Yanagidaira et al. |
| 2010/0067278 A1 | 3/2010 | Oh et al. |
| 2011/0093647 A1 * | 4/2011 | Lai et al. ....................... 711/103 |

OTHER PUBLICATIONS

RamLink: A High-Bandwidth Point-to-Point Memory Architecture (Gjessing Compcon Feb. 24-28, 1992.pdf).
A RAM link for high speed (Gjessing Spectrum Oct. 1992.pdf).
Performance of the RamLink Memory Architecture (Gjessing Hawaii International Conference on System Sciences Jan. 4-7, 1994 .pdf).
SyncLink: High Speed DRAM for the future (Diamond Micro Dec. 1996.pdf).
High Speed Memory Architectures for multimedia application (Oshima Circuits & Devices Jan. 1997.pdf).
8Mbit Serial Flash Memory (Atmel_8M_SerialFlasheMemory.pdf).
16Mbit SPI Serial Flash (SST25VF016B_16 Mbit SPI Serial Flash.pdf).
2Mbit Serial Flash Memory (ST_M25P20_SerialFlashMemory.pdf).
(I2C Bus Specification Version 2.1 Jan. 2000, Philips_I2C_spec_39340011.pdf).
HL7B4C11-1W (HLNAND Interface Chip Specification) Ver.0.7, Apr. 17, 2009.
HL7F64G24CB11-1W (HyperLink NAND (HLNAND) Flash Specification) Ver.0.3, Apr. 17, 2009.
How to Connect Single Level NAND Flash Memories to Build Storage Modules, Nov. 2004, pp. 1-7.
ISSCC 2008 / Session 23 / Non-Volatile Memory / 23.4 Paper (A 50nm 8Gb NAND Flash Memory with 100MB/s Program Throughput and 200MB/s DDR Interface), pp. 1-3.
ISSCC 2008 / Session 23 / Non-Volatile Memory / 23.4 Power Point Slides (A 50nm 8Gb NAND Flash Memory with 100MB/s Program Throughput and 200MB/s DDR Interface).
MC68HC05X4, HCMOAS Microcontroller Unit, Technical Data, Motorola, Inc., 1998.
Micron 8, 16, 32Gb: High Speed NAND Flash Memory, 2008.
ONFi (Open NAND Flash Interface Specification), Revision 2.2, Oct. 7, 2009.

* cited by examiner

SYSTEM OF INTERCONNECTED NONVOLATILE MEMORIES HAVING AUTOMATIC STATUS PACKET

CROSS REFERENCE

This application claims the benefit of U.S. Provisional Application No. 61/328,388, filed Apr. 27, 2010, the contents which are incorporated herein by reference in its entirety.

TECHNICAL FIELD

The present invention relates generally to a semiconductor memory. More particularly, the invention relates to series-connected nonvolatile memory devices.

BACKGROUND

Nonvolatile memory retains its contents even if the power is lost. Flash EEPROM memory can be electrically programmed a single byte or word at a time, but a large group of bytes or words—called a block, sector, or page—are electrically erased at the same time. Flash EEPROM devices are called Flash erase EEPROM, or simply Flash memories. The Flash memory cell uses a single transistor to store one or more bits of information. Flash memory has become the dominant type of nonvolatile memory in use. Two main architectures dominate the Flash memory: NOR and NAND. A synchronous high speed NAND Flash memory system configuration adopting a ring topology has been proposed. In the ring topology, a plurality of flash devices is connected. Each of the devices has a status: for example, "ready", "busy".

SUMMARY

According to one broad aspect, the invention provides a memory device comprising: a non-volatile memory array; a data output port for outputting data read from the memory array; a status maintainer that maintains status information identifying a status of the memory device; a status transmitter that, responsive to a change in the status information, transmits a status signal using at least the data output port.

According to another broad aspect, the invention provides a memory device comprising: a non-volatile memory array; a data output port for outputting data read from the memory array; a status maintainer that maintains status information identifying a status of the memory device; a status transmitter that, responsive to a change in the status information, transmits a status signal; a first receiver for receiving a first input signal; a second receiver for receiving a second input signal; a first transmitter for transmitting a first output signal and a second transmitter for transmitting a second output signal; wherein a command input is indicated by the first input signal being asserted and the second input signal being de-asserted; wherein a data input is indicated by the first input signal being de-asserted and the second input signal being asserted; the memory device further comprising an echo generator that causes the first output signal to be asserted after the first input signal is asserted, and causes the second output signal to be asserted after the second input signal is asserted; wherein the status transmitter, responsive to a change in the status information, transmits the status signal by causing the first output signal and the second output signal to be simultaneously asserted.

According to another broad aspect, the invention provides a method comprising: outputting data read from a memory array of a memory device through a data output port; maintaining status information identifying a status of the memory device; responsive to a change in the status information, transmitting a status signal using at least the data output port.

According to another broad aspect, the invention provides a method comprising: a data output port for outputting data read from a memory array of a memory device through a data output port; maintaining status information identifying a status of the memory device; receiving a first input signal; receiving a second input signal; transmitting a first output signal and a transmitting a second output signal; wherein a command input is indicated by the first input signal being asserted and the second input signal being de-asserted; wherein a data input is indicated by the first input signal being de-asserted and the second input signal being asserted; the method further comprising: causing the first output signal to be asserted after the first input signal is asserted, and causing the second output signal to be asserted after the second input signal is asserted; responsive to a change in the status information, transmitting a status signal by causing the first output signal and the second output signal to be simultaneously asserted.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1A:
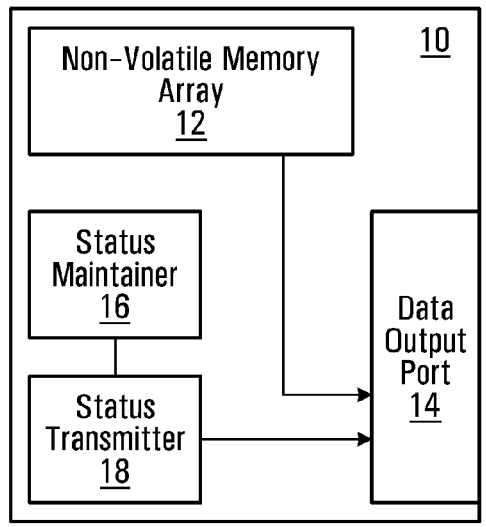
FIG. 1A is a functional block diagram of a memory device provided by a first embodiment of the invention.

Some NAND flash memory systems use a large number of parallel signals for the commanding, addressing, and data transferring of system operations. This was a very popular way of configuring memory systems and results in very fast system operation. This is particularly true for random access memory devices like DRAM, SRAM, etc. A disadvantage arises from this approach in that a large number of parallel signal lines needs to be routed to each and every memory device in the memory system. Also, the system power supply must have higher capacity in order to deliver higher peak power for parallel signaling. Write and read throughput for NAND flash memory can be directly increased by higher operating frequency of the NAND Flash memory. For example, the present operating frequency of about 40 MHz (=25 ns for tRC in NAND Flash) can be increased by an order of magnitude to about 100~200 MHz. While this approach appears to be straightforward, there is a significant problem with signal quality at such high frequencies, which sets a practical limitation on the operating frequency of the NAND flash memory. In particular, the NAND flash memory communicates with other components using a set of parallel input/output (I/O) pins, numbering 8 or 16 depending on the desired word configuration, which receive command instructions, receive input data and provide output data. This is a parallel interface or multi-drop connection. High speed operation will cause well known communication degrading effects such as cross-talk, signal skew and signal attenuation, for example, which degrades signal quality. Such parallel interfaces use a large number of pins to read and write data. As the number of input pins and wires increases, so do a number of undesired effects. These effects include inter-symbol interference, signal skew and cross talk. Inter-symbol interference results from the attenuation of signals traveling along a wire and reflections caused when multiple elements are connected to the wire. Signal skew occurs when signals travel along wires having different lengths and/or characteristics and arrive at an end point at different times. Cross talk refers to the unwanted coupling of signals on wires that are in close proximity. Cross talk becomes more of a problem as the operating speed of the memory device increases.

Other than NAND Flash memory area, there is Serial Flash memory in the semiconductor industry. For example, 8 Mbit Serial Flash Memory (Atmel_8M_SerialFlasheMemory.pdf), 16 Mbit SPI Serial Flash (SST25VF016B_16 Mbit SPI Serial Flash.pdf) and 2 Mbit Serial Flash Memory (ST_M25P20_SerialFlashMemory.pdf) use serial bus interface scheme which operate in the range of 1 MHz~20 MHz with the SPI (Serial Peripheral Interface) or I2C (Inter-Integrated Circuit) compatible interface. However, those serial interface standards are usually slower than their parallel counterparts. (I2C Bus Specification Version 2.1 Jan. 2000, Philips_I2C_spec_39340011.pdf).

Such serial flash memories are widely used in small size data storage applications such as a computer system's BIOS data. Because of the natural characteristics of such a small amount of density and relatively very slow operating requirement, serial flash EEPROM devices do not need the complex data transferring bus scheme used in conventional NOR type Flash EEPROM or NAND type Flash EEPROM memory devices. Instead of a large number of signal pins, serial flash memories have very few signal pins.

A first example of a serial interface is the SPI specification having SCK (Serial Clock), SDI (Serial Data In), SDO(Serial Data Out), CE#(Device Enable #) and power supply pins. The SPI-bus is a 4-wire serial communications interface used by many microprocessor peripheral devices. The Serial Peripheral Interface (SPI) circuit is a synchronous serial data link that is standard across many Motorola microprocessors and other peripheral devices. It provides support for a low/medium bandwidth (1 mega-baud) network connection amongst CPUs and other devices supporting the SPI. SPI bus is basically a relatively simple synchronous serial interface for connecting low speed external devices using a minimal number of wires. SPI is an interface standard defined by Motorola on the MC68HCxx line of microcontrollers. A synchronous clock shifts serial data into and out of the microcontrollers in blocks of 8 bits. SPI is used frequently in handheld and other mobile platform systems. SPI bus is a master/slave interface. Whenever two devices communicate, one is referred to as the "master" and the other as the "slave" device. The master drives the serial clock. When using SPI, data is simultaneously transmitted and received, making it a full-duplexed protocol. Motorola's names for the signals are as follows: SCLK for serial clock, which is always driven by the master: MISO is master-in slave-out data: MOSI is master-out slave-in data. In a typical application, connect the microcontroller's SCLK to the slave device SCLK input, connect the MISO to the slave device's DOUT pin, and connect the MOSI pin to the slave device's DIN pin. With serial protocols such as SPI, a device-select input is required to enable the IC. Using this device-select signal it is possible to connect many ICs to same SPI bus in parallel. If there is a device-select (CS) signal in use, it can be driven by a spare microcontroller general-purpose output. Every IC connected to the bus needs its own device-select signal line. Thus, when 10 devices are on the bus, 10 device-select lines, in addition to the shared clock and data lines, are needed to select the appropriate device.

Another example of a serial interface is described in the I2C-Bus Specification referred to above and uses even fewer pin configurations. The I2C bus uses only two bidirectional open-collector lines, serial data line (SDA) and serial clock line (SCL), pulled high with resistors. The maximum voltage is +5 V, although +3.3 V systems are common and other voltages are permitted. I2C is appropriate for peripherals where simplicity and low manufacturing cost are more important than speed. Common applications of the I2C bus are, NVRAM devices that keep user settings, low speed DAC/ADC, PC monitors, LED displays, cell phones, real time clocks and power supply of system components. A particular strength of I2C is that a microcontroller can control a network of devices with just two general-purpose I/O pins and software. Peripherals can also be added to or removed from the I2C bus while the system is running, which makes it ideal for applications that require hot swappable components. Buses like I2C became popular when computer engineers realized that much of the manufacturing cost of an integrated circuit design results from its package size and pin count. A smaller package also usually weighs less and consumes less power, which is especially important in cell phones and portable computing. The I2C reference design has a 7-bit address space with 16 reserved addresses, so a maximum of 112 nodes can communicate on the same bus. The most common I2C bus modes are the 100 Kbps standard mode and the 10 Kbps low-speed mode, but clock frequencies down to zero are also allowed. Recent revisions of I2C can host more nodes and run faster (400 Kbps Fast mode and 3.4 Mbps High Speed mode).

An alternative solution to overcome the disadvantages of parallel interface schemes for flash memory is disclosed in U.S. Pat. No. 5,430,859 "Solid State Memory System Including Plural Memory Devices and a Serialized Bus". This approach presented a serial link interconnect between the flash memory devices and the memory controller, which claimed the reductions of the number of interconnections and the number of external pads for each device.

More recently, a much faster high speed NAND flash memory system, which is called HyperLink NAND (HL-NAND™), has been proposed. HyperLink may support any kind of memory including NOR Flash, DRAM, or emerging memory. The first device that has been fully defined is HyperLink NAND Flash, or HLNAN. HyperLink may be a unidirectional ring in which data is passed from device to device over point-to-point connections. Although each device adds one clock cycle of latency, this is not an issue in mass storage applications. The latency around the ring is typically less than 1% of the time it takes to read or write the Flash memory device. HLNAND system commands may be used to direct the HLNAND memory devices to perform various operations (e.g., page read, page program or block erase). The commands are typically embedded in a serial data stream that is transferred from a host controller to the memory devices via a serial bus defined by the HyperLink architecture. Parameters that are associated with the command (e.g., addresses, data) may also be included in the serial stream. The command and parameter information may be "tagged" with codes so that they may be identified by the memory devices. For example, a two-bit code may precede a command in the serial stream to indicate that the information following the code is a command. Likewise, data and address information may each be preceded in the stream with codes to identify this information.

Nonvolatile memory is memory that retains its contents even if the power is lost. Nonvolatile memory was originally called Read Only Memory (ROM) because its contents were loaded during the manufacturing process and could be read, but never erased or reprogrammed. Over time, the ability to erase and reprogram ROM was added in different ways and referred to as Electrically Programmable ROM (EPROM), Electrically Erasable and Programmable ROM (EEPROM), and Flash EEPROM—commonly referred to simply as Flash memory. ROM memory is programmed by the way it is manufactured and stores permanent code and data that is generally used to initialize and operate a computer system. EPROM can be electrically programmed one byte at a time but is not electrically erasable. It has to be exposed to ultraviolet (UV) light for about twenty minutes in order to erase all bits in the memory array. EPROM uses a single transistor for each data bit and can be used in relatively high density memories. EEPROM is electrically erasable and programmable in-system, one byte at a time, but the memory cells use more transistors and are larger than those in EPROMs, thus EEPROM has higher costs and lower density (generally less than 1 Mb).

Flash EEPROM memory can be electrically programmed a single byte or word at a time, but a large group of bytes or words—called a block, sector, or page—are electrically erased at the same time. Due to the erase operation being much faster than the prior EPROM or EEPROM devices, these devices came to be called Flash erase EEPROM, or simply Flash memories. The Flash memory cell uses a single transistor to store one or more bits of information. Flash technology combines the high density of EPROM with the electrical in-system erase and programmability of EEPROMs. Flash memory has become the dominant type of nonvolatile memory in use.

Two main architectures dominate the Flash memory: they are NOR and NAND. NOR flash is typically used for code storage and execution. NOR flash allows quick random access to any location in the memory array, 100% known good bits for the life of the part, and code execution directly from NOR Flash memory. NAND flash is generally used for data storage. NAND Flash requires a relatively long initial read access to the memory array, 98% good bits when shipped with additional bit failure over the life of the part (therefore ECC, Error-Correction-Code, is highly recommended), program/erase times are much faster than NOR, and NAND costs less per bit than NOR. Conventional NAND flash memory systems use a large number of parallel signals for the commanding, addressing, and data transferring of system operations. This was a very popular way of configuring memory systems and results in very fast system operation. This is particularly true for random access memory devices like DRAM, SRAM, etc.

NAND flash signals include CLE (Command Latch Enable), ALE (Address Latch Enable), CE# (Device Enable), RE# (Read Enable), WE# (Write Enable) and R/B# (READY/BUSY). Those signals are connected to corresponding signal ports of the NAND flash memory devices, where "#" indicates a signal that is asserted at a logic low level. Device enable signal CE# provides selection control: other signals can be routed to multiple NAND flash memory devices, and the only device that will respond is the one to which the host controller asserts CE#. Read enable signal RE# actually causes the NAND flash memory device to drive read data onto the I/O bus when asserted. Write enable signal WE# causes the NAND flash memory device to latch address, command, or write data off of the I/O bus on a positive transition. Command latch enable signal CLE, when asserted, causes data latched at the NAND flash memory device's I/O port to be interpreted as a command. Likewise, address latch enable signal ALE, when asserted, causes data latched at the NAND flash memory device's I/O port to be interpreted as address data. Input/output signals, I/O 0-I/O 7, are driven by the host controller to transfer commands, address, and write data to the NAND flash memory device. In a read operation, I/O 0-I/O 7 are driven by the NAND flash memory device to transfer read data to the host controller. When the host controller and the NAND flash memory device are not driving the I/O bus, they each place their respective drivers in a high-impedance (high-z) state. Also, the NAND flash memory device has the capability to drive READY/BUSY signal R/B# to the host controller. The NAND flash memory device usually pulls this R/B# signal low when it is programming, erasing, or reading from the NAND flash cell array.

In a page read operation, for example, the NAND flash memory device pulls R/B# low while the specific page is accessed from the NAND flash memory array to indicate that it is busy. When R/B# returns to a high state, the host controller is permitted to take RE# low (while CE# is low) to cause the NAND flash memory device to drive a first data information onto the I/O bus. The controller then takes RE# high as it latches the read data off of the I/O bus. The NAND flash memory device then returns the I/O bus to a high-z state and awaits a new read cycle. Because of the presence of the R/B# signal, the host controller can easily monitor the status of the NAND flash memory. However, those above mentioned NAND flash memory devices are generally operate at slower speed as like 33 MHz to 50 MHz in asynchronous way.

Therefore, there were several proposals regarding to the synchronous high speed NAND Flash memory system configuration adopting a ring topology. For example, U.S. Pat. No. 7,688,652 'Storage of data in memory via packet strobing', U.S. Pat. No. 7,652,922 'Multiple Independent Serial Link Memory', U.S. Pat. No. 7,515,471 'Memory with Output Control', U.S. Publication 2007076502 'Daisy Chain Cascading Devices', U.S. Publication 20070143677 'Independent Link and Bank Selection', U.S. Publication 20080080492 'Packet Based ID Generation for Serially Interconnected', U.S. Publication 20070233917 'Device ID in Serially Interconnected' and U.S. Publication 20070234071 'Asynchronous ID generation'.

These proposals show serial in/out data pins (SIP for 'Serial Input Port' & SOP for 'Serial Output Port') along with two control signals (IPE & OPE) for the enabling and disabling of serial input port (=IPE) and serial output port (=OPE) respectively in order to provide the memory controller with the maximum flexibility of serial data communication. In the recent proposal 'HLNAND Flash Specification', different names for SIP/SOP/IPE/OPE are used, which are Dn/Qn/CSI/DSI respectively, but all the functionality of each signal is the same. In those previous proposals, CSI (or IPE) signal controls both 'command/address' input and 'write-data' input, while DSI (or OPE) signal controls only a 'read-data' output.

U.S. Pat. No. 7,688,652, the storage of data in memory via packet strobing has fully serialized high speed serial link of in/out pins (=Dn for Serial Data Input Port, Qn for Serial Data Output Port) along with two dedicated control signals (=CSI for Command/Address Packet only, DSI for Write & Read Data Packet) for the enabling and disabling of 'command/address packet' and 'data packet', respectively.

Even with the above mentioned approaches mentioned in the background, the serially interconnected nonvolatile memory system (ex. HLNAND memory system), which is adopting packet protocol interface for command, address and data altogether, may suffer from the performance degradation because the host controller has to send a status read packet periodically in order to monitor whether the slave memory device(s) in the ring is busy or ready. This may cause some serious read or write performance degradation in the ring topology architecture. The simple solution would be adding R/B# signal and ports to every slave memory device like the conventional slow NAND flash memory system. However, this may cost more for the added pin and PCB routings, and this is not well aligned with the concept of a serial ring topology system.

A problem with the above-described HyperLink bus design is that the host controller has to monitor the HLNAND memory devices in the ring to figure out the specific memory devices that are in "READY" or "BUSY" status through the serial interface only because there is no dedicated R/B# port as in the NAND flash memory system. For example, if the host controller has issued a "page program" command to one of the HLNAND device in the ring, the controller has to wait the certain maximum amount of time which is specified in the data sheet of the HLNAND device, or the controller has to issue "status read" command periodically to find out the "READY/BUSY" status of the specific HLNAND device.

Therefore, it would be advantageous to have a smart and cost effective way to monitor the status for the interconnected nonvolatile memory system without sacrificing read or write throughput performance caused by much unnecessary status polling operation by the host controller.

Systems and methods are provided that implement an automatic status output without adding the physical R/B# pins for checking READY/BUSY status of the memory devices.

Referring to FIG. 1A, shown is a schematic diagram of a memory device, generally indicated at 10, provided by an embodiment of the invention. The memory device 10 has a non-volatile memory array 12. Data read from the non-volatile memory array 12 is output from data output port 14. A status maintainer 16 maintains status information identifying a status of the memory device. A status transmitter 18 transmits a status signal using at least the data output port. The status transmitter 18 transmits the status signal responsive to a change in the status information maintained by the status maintainer 16. The status signal may, in addition, use other output ports, not shown. Examples of this are provided below.

It should be apparent that data output port 14 is not dedicated to outputting the status information for the memory device; it is also used to output data read from the non-volatile memory array 12. The example of FIG. 1 shows the minimum functionality for generating the status output; of course, additional components and functionality would be present as would be understood by a person skilled in the art. A specific example is a data transmitter that transmits data read from the non-volatile memory array 12 through the data output port 14; circuitry used to implement such a data transmitter may overlap with circuitry used to implement the status transmitter 18.

In operation, the status of the memory device is maintained by the status maintainer 16. When there is a change in status, the status transmitter 18 transmits a status signal that uses at least the data output port 14. In a specific example, the status maintainer 16 maintains a ready/busy status of the memory device. Responsive to a change in state from busy to ready and/or from busy to ready the status transmitter 18 transmits the status signal. In some embodiments, the status signal that uses at least the data output port includes a status byte transmitted on the data port, together with at least one indicator on at least one other output port that indicates the byte being output on the data output port is a status byte. In the embodiments below, the at least one indicator on the at least one other output port is an asserted output on each of a data strobe output and a command strobe output, but other implementations are possible.

The previously proposed unidirectional nonvolatile memory system (HLNAND system) has described a nonvolatile memory device and memory system that fully serializes a single set of serial input and output pins which are Dn (=Serial Input Port) and Qn (=Serial Output Port), where n is an integer number, along with two control signals, CSI (=Command Strobe Input) and DSI (=Data Strobe Input), for the enabling and disabling of 'command/address/write data packet' and 'read data packets' respectively. Along with CSI and DSI pins, there are CSO (=Command Strobe Output) and DSO (=Data Strobe Output) pins in order to provide a system controller a more effective way for receiving feedback response from the memory in synchronous manner. This is to provide the host controller maximum flexibility of data communication. The memory device receives the command, address and write data information packet through Dn port(s) only when CSI stays in 'High' logic state (=asserted), and also the memory device transmits the read output data packets through Qn port(s) only when DSI stays in 'High' logic state (=asserted). When CSI signal is asserted (=i.e. goes to 'High' state) referenced at the rising or falling edges of free-running clock signal (CKI), the memory device starts to receive, through Dn port(s), consecutive serial input stream bytes (=Command and/or Address and/or Data Input Packet) which are device ID byte(s), command byte(s) and/or address byte(s) and/or write data input byte(s) in number of clock cycles for each operation cases. If CSI signal is de-asserted (i.e. goes to 'low' state), the memory device stops to receive Command & Address & Write Data Packet through Dn port(s). When DSI signal is asserted (i.e. goes to 'High' state) while a memory device is in read primed mode, the memory device starts to transmit 'Read-Data Packet', through Qn port(s), referenced at the rising or falling edges of free-running clock signal (CKI). If DSI signal is de-asserted (i.e. goes to 'low' state), the memory device stops transmitting 'Read-Data Packet' through Qn port(s).

In the normal course of events, the only combinations of (CSI, DSI) that will occur are (idle, idle), (asserted, idle), or (idle, asserted). Correspondingly the only combinations of {CSO, DSO} that will occur are {idle, idle}, {asserted, idle} and {idle, asserted}. In accordance with an embodiment of the invention, the {asserted, asserted} combination for {CSO, DSO} is used to provide status information. A methodology of automatic status packet generation from the memory devices connected in series manner having the serial ring link interface structure is provided. If one of the memory devices in the ring changes its status from "BUSY" to "READY", the memory device tries to raise CSO and DSO signals at the same time only if CSI and DSI signals are in "idle" state, which is 'LOW' logic state for example. Both 'HIGH' logic states on the CSO and DSO at the same time referenced at the rising or falling edges of clock signal are defined as a specific example of an 'Automatic Status Packet', and it will indicate that the memory device has become "READY" status from "BUSY" status under defined circumstances, for example following long memory device operations, such as page program, page read or block erase, etc. The 'Automatic Status Packet' can be one clock cycle long or any number of clock cycles long depending on the system and device requirements. Even a half clock cycle long packet is possible in case of synchronous DDR operation. Also In some embodiments, the 'Automatic Status Packet' can contain device ID information and/or other status information via Qn ports when both CSO and DSO are asserted. The 'Automatic Status Packet' from one memory device in the interconnection arrangement can flow through the serially interconnected signal path. The host controller will receive the automatic status packet through its CSI and DSI ports after certain amount of cycles defined by the number of devices in the chain. In some embodiments, the host controller can issue a read status command packet to the memory device (where the "Automatic Status Packet" contains device ID information) or can issue a broadcast read status command to the entire memory devices in the chain (where the "Automatic Status Packet" does not contain device ID information) in order to figure out which memory device has become "READY" and/or to figure out the pass/fail results of the memory operation on the memory device. This simple and short packet operation can achieve very effective link utilization and does not degrade overall system performance that might otherwise be caused by abundant status polling operations such as those in current HLNAND flash based SSD system.

The proposed technique can be applied to any kind of solid state memory system such as NAND Flash EEPROM, NOR Flash EEPROM, AND Flash EEPROM, DiNOR Flash EEPROM, Serial Flash EEPROM, DRAM, SRAM, ROM, EPROM, FRAM, MRAM, PCM etc. The approach is particularly suitable for series connected devices with strobe delineated packets. The approach can be applied to the recently proposed HyperLink NAND system.

In some embodiments, the memory system is a packet oriented memory system. In a specific implementation, three types of packets are implemented: "Command and Write Data Packet (=CWDP)", "Read Data Packet (=RDP)" and "Automatic Status Packet (=ASP)". "Command and Write Data Packet" contains command and/or address and/or write data information. "CWDP" arrives at the memory device through the serial data input port(s), Dn, and are delineated by a strobe signal, CSI (=Command Strobe Input). "Read Data Packet" contains read data coming out of the memory device and heading back to the memory controller through the serially connected memory devices. "RDP" departs from the memory device through the serial data output port(s), Qn, and are delimited by a strobe signal, DSO (=Data Strobe Out). "ASP" may or may not contain device ID information and outputted by the memory device and traveling toward the host controller through the serial data output port(s), Qn. All "CWDP", "RDP" and "ASP" should be an integral number of bytes long, regardless of the current I/O width (=1, 2, 4 or 8-bit wide). Memory data transfers are specified by a start address and a transfer length. The transfer length is as defined by the length of the corresponding strobe signals (=CSI or DSI) from its rising edge to its falling edge, for example.

The memory device receives the command, address and/or write data information packet through Dn port(s) only when CSI stays in 'High' logic state (=asserted), and also the device transmits the output data packets through Qn port(s) only when DSI is in 'High' logic state (=asserted). When CSI signal is asserted (='High' state), the memory device starts to receive, through Dn port(s) referenced at the rising edges of clock signal (CKI, Complementary clock signal CKI# is at the falling edges, of course, and it is an optional choice for some other preference which is varying on the system design), consecutive serial input stream bytes which are device address byte(s), command byte(s), address byte(s) and/or write data byte(s) in number of clock cycles for each command cases. If CSI signal is de-asserted (='low' state), the memory device stops to receive the packet through Dn port(s). And when DSI signal is asserted (i.e. goes to 'High' state) while a memory device is in Read-Mode, the memory device starts to transmit 'Read Data Packet', through Qn port(s), referenced at transition edges of clock signals (CKI/CKI#). If DSI signal is de-asserted (i.e. goes to 'Low' state), the memory device stops transmitting 'Read Data Packet' through Qn port(s).

Figure 1B:
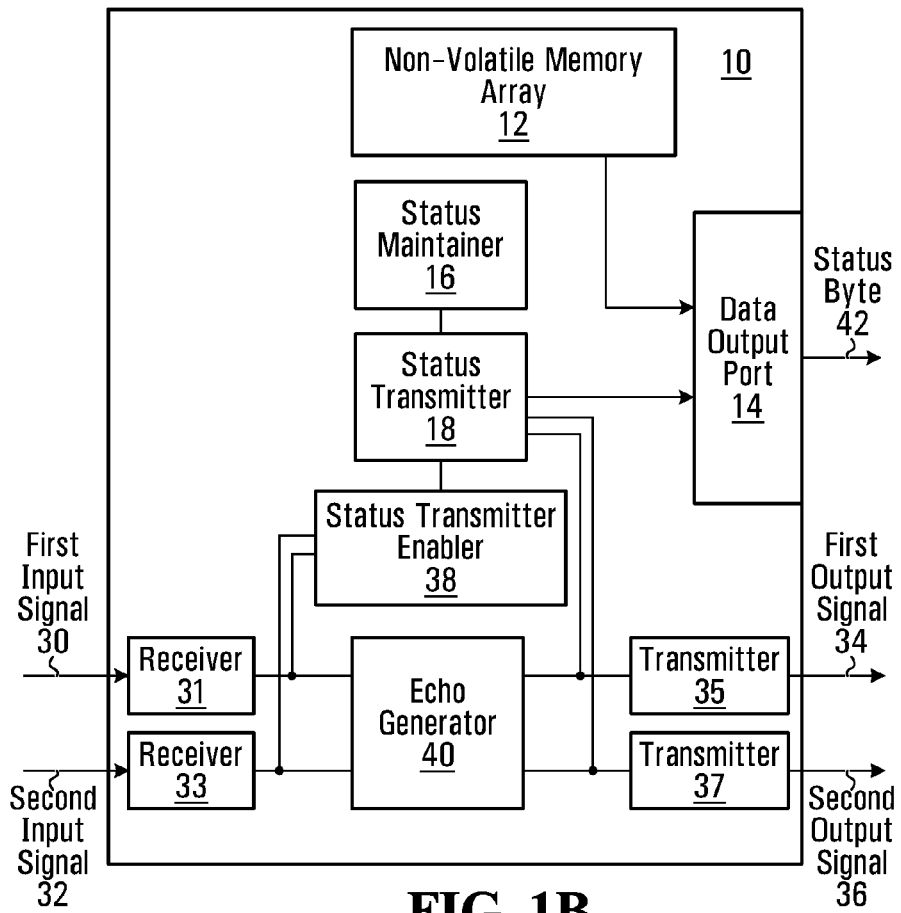
FIG. 1B is a functional block diagram of another memory device provided by a second embodiment of the invention.

FIG. 1B shows another memory device provided by an embodiment of the invention. In addition to the functionality of FIG. 1A, which is shown in FIG. 1B using like reference numbers, the memory device of FIG. 1B includes a first receiver 31 that receives a first input signal, and a second receiver 33 that receives a second input signal 32. An echo generator 40 generates an echo of the first input signal 30 that is transmitted by transmitter 35 as first output signal 34, and generates an echo of the second input signal 32 that is transmitted by transmitter 37 as second output signal 36. Some embodiments also feature a status transmitter enabler 38. The status transmitter enabler 38 has an output connected to the status transmitter 18 and is also connected to receive the outputs of receivers 31,33. This embodiment is based on a system that employs a command strobe input and a data strobe input, and a command strobe output and a data strobe output. However, the outputs strobes are now also used to convey that a current output is a status output. In addition, for serially interconnected devices, for a device downstream of a device that outputted such a status output, the input strobes will convey that a current input is a status output of a preceding device. In this case, the strobes and the status packet are simply echoed.

In operation, a command input is indicated by the first input signal 30 being asserted and the second input signal being de-asserted 30. A data input is indicated by the first input signal 30 being de-asserted and the second input signal 32 being asserted. The echo generator 40 causes the first output signal 34 to be asserted after the first input signal is asserted, and causes the second output signal 36 to be asserted after the second input signal is asserted. The status transmitter 18, responsive to a change in the status information, transmits the status signal using at least the data output port by:

transmitting the status information on the data output port as status byte(s) 42;

causing the first output signal 34 and the second output signal 36 to be simultaneously asserted.

The status transmitter enabler 38 allows the status transmitter 18 to transmit the status signal only when neither the first input signal 30 nor the second input signal 32 is being asserted. This avoids a conflict with the use of the first and second output signals 34,36 to echo the first and second input signals 30,32.

The status enabler 38 allows the status transmitter to transmit the status signal only when neither the first input signal nor the second input signal is being asserted. This avoids a conflict with the use of the first and second output signals 34,36 to echo the first and second input signals 30,32.

FIG. 1 illustrates an exemplary Functional Block Diagram. Table 1 shows Exemplary Pin Descriptions.

operate on a HyperLink ring with devices that have smaller or larger maximum link widths provided they are all programmed to use the same Current Link Width.

CKI and CKI# are input clocks. Command and Write Data Packet on Dn ports is latched on the rising edges of CKI and the falling edges of CKI#. Read Data Packet on Qn is referenced at both rising edges of CKI/CKI#.

CKO/CKO# are optional output clocks (FIG. 3) which are delayed or phase-locked version of CKI/CKI#. These pins are optional if multi-drop style clocking is employed. CSO, DSO

TABLE 1

| Pin Name | Type | Description |
| --- | --- | --- |
| CKI/CKI# | Input | Clock Input: CKI is an input clock. CSI, DSI and Dn signals are latched at the rising edges of CKI. |
| CKO/CKO# | Output | Clock Output: CKO is an output clock which is delayed or phase-locked version of CKI. CSO, DSO and Qn signals are referenced to the rising edges of CKO. |
| Dn | Input | Data Input: Dn (n = 0, 1, 2, 3, 4, 5, 6 or 7) receives command, address and input data. If the device is configured in '1-bit Link mode (= default)', D0 is the only valid signal and receives one byte of packet in 8 clock cycles. If the device is configured in '2-bit Link mode', D0 & D1 are only valid signals and receive one byte of packet in 4 clock cycles. If the device is configured in '4-bit Link mode', D0, D1, D2 & D3 are all valid signals and receive one byte of packet in 2 clock cycles. If the device is configured in '8-bit Link mode', D0, D1, D2, D3, D4, D5, D6 & D7 are all valid signals and receive one byte of packet in 1 clock cycle. Unused data input pins are grounded. |
| Qn | Output | Data Output: Qn (n = 0, 1, 2, 3, 4, 5, 6 or 7) transmits output data during read operation or bypasses command, address or input data received on Dn. If the device is configured in '1-bit Link mode (= default)', Q0 is the only valid signal and transmits one byte of packet in 8 clock cycles. If the device is configured in '2-bit Link mode', Q0 & Q1 are the only valid signals and transmit one byte of packet in 4 clock cycles. If the device is configured in '4-bit Link mode', Q0, Q1, Q2 & Q3 are all valid signals and transmit one byte of packet in 2 clock cycles. If the device is configured in '8-bit Link mode', Q0, Q1, Q2, Q3, Q4, Q5, Q6 & Q7 are all valid signals and transmit one byte of packet in 1 clock cycle. Unused data output pins are DNC (= Do Not Connect). |
| CSI | Input | Command Strobe Input: When CSI is HIGH, command and address inputs through Dn are latched on the rising edges of CKI. |
| CSO | Output | Command Strobe Output: Echo signal of CSI. It bypasses CSI transitions with one clock cycle latency, for example, referenced to the rising edges of CKO. It automatically goes to HIGH for one clock cycle period, for example, along with DSO in order to indicate that the device becomes READY state from BUSY state. |
| DSI | Input | Data Strobe Input: If DSI is HIGH while the device is in 'read-mode', it enables the read data output path and Qn buffer. If DSI is LOW, the Qn buffer holds the previous data accessed. If DSI is HIGH while the device is in 'write-mode', it enables Dn buffer and the write data input path. |
| DSO | Output | Data Strobe Output: Echo signal of DSI. It bypasses DSI transitions with one clock cycle latency, for example, referenced to the rising edges of CKO. It automatically goes to HIGH for one clock cycle period, for example, along with CSO in order to indicate that the device becomes READY state from BUSY state. |
| CE# | Input | Chip Enable: When CE# is LOW, the device is enabled. Once device becomes "BUSY", CE# pin may be HIGH. In addition, CE# LOW activates and CE# HIGH deactivates the internal clock signals. |
| RST# | Input | Chip Reset: RST# provides a reset for the device. When RST# is HIGH, the device is on the normal operating mode. When RST# is LOW, the device will enter the Reset mode. |

Figure 2:
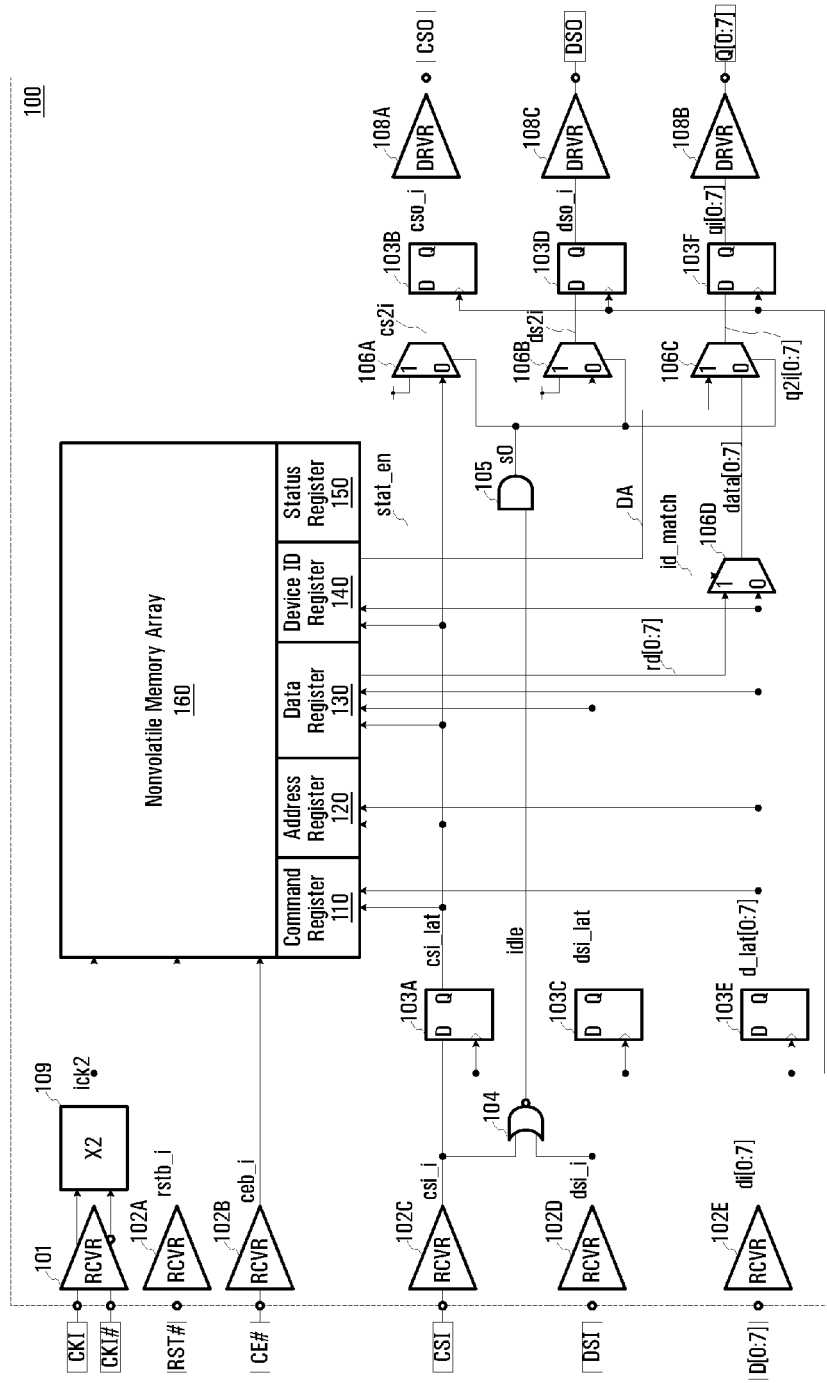
FIG. 2 illustrates an exemplary functional block diagram.

Referring to FIG. 2 and Table 1, the memory device 100 uses a highly multiplexed unidirectional point-to-point bus architecture to transfer information such as commands, addresses and data through the bus, also referred to as a "Link". Typically, one single link consists of six signals, CSI (=Command Strobe Input), CSO (=Command Strobe Output), DSI (=Data Strobe Input), DSO (=Data Strobe Output), Dn (=Data Input), and Qn (=Data Output), where n=0 for 1-bit Link setting; n=0, 1 for 2-bit Link setting; n=0, 1, 2, 3 for 4-bit Link setting; n=0, 1, 2, 3, 4, 5, 6, 7 for 8-bit Link setting, along with two differential clock input signals, CKI/CKI#, and optional (not shown in this document for the purpose of simplicity) common signals CE# (Chip Enable) and RST# (Reset). The width of the link may be programmed, for example through the device's Link Configuration Register, to utilize 1, 2, 4, or 8 of the device package's available data input and output pins. This feature allows these memory devices to and their delineated Qn signals are referenced to both rising and falling edges of CKO/CKO#.

When Command Strobe Input, CSI, is HIGH, Command and Write Data Packets through Dn are latched on the rising and/or falling edges of CKI/CKI#.

Command Strobe Output CSO is an echo signal of CSI. It bypasses (= or echoes) CSI transitions with a clock cycle latency referenced to the rising edges of CKO. One clock cycle latency is one example of the proposed technique, however it could be any number of clock cycles depending on the design choices.

When Data Strobe Input DSI is HIGH while the memory device is in 'Read-Mode', it enables the read data output path and Qn buffer. If DSI is LOW, the Qn buffer holds the previous data accessed.

Data Strobe Output DSO is an echo signal of DSI. It bypasses (= or echoes) DSI transitions with one clock cycle latency referenced to both rising and falling edges of CKI/CKI#. Because DSI and DSO are DDR based signals, one clock cycles latency is equivalent with two half-clock cycles, and it is possible to have any different latency values according to design variations.

Data Input signal Dn (n=0,1,2,3,4,5,6 or 7) carries command, address and/or input data information. If the chip is configured in 1-bit Link mode (=default)', D0 is the only valid signal and receives one byte of packet in 8 clock cycles in SDR manner or in 4 clock cycles in DDR manner. If the chip is configured in '2-bit Link mode', D0 & D1 are only valid signals and receive one byte of packet in 4 clock cycles in SDR manner or in 2 clock cycles in DDR manner. If the chip is configured in '4-bit Link mode', D0, D1, D2 & D3 are all valid signals and receive one byte of packet in 2 clock cycles in SDR manner or in 1 clock cycles in DDR manner. If the chip is configured in '8-bit Link mode', D0, D1, D2, D3, D4, D5, D6 & D7 are all valid signals and receive one byte of packet in 1 clock cycle in SDR manner or in one half clock cycle in DDR manner.

Data Output signal Qn (n=0, 1, 2, 3, 4, 5, 6 or 7) carries output data during read operation or bypasses command, address or input data received on Dn. If memory device is configured in 1-bit Link mode (=default)', Q0 is the only valid signal and transmits one byte of packet in 8 clock cycles in SDR manner or in 4 clock cycles in DDR manner. If the chip is configured in '2-bit Link mode', Q0 & Q1 are the only valid signals and transmit one byte of packet in 4 clock cycles in SDR manner or in 2 clock cycles in DDR manner. If the chip is configured in '4-bit Link mode', Q0, Q1, Q2 & Q3 are all valid signals and transmit one byte of packet in 2 clock cycles in SDR manner or in 1 clock cycles in DDR manner. If the chip is configured in '8-bit Link mode', Q0, Q1, Q2, Q3, Q4, Q5, Q6 & Q7 are all valid signals and transmit one byte of packet in 1 clock cycle in SDR manner or in one half clock cycle in DDR manner.

The memory device 100 has a nonvolatile Memory Array (160) which may be a single bank of nonvolatile memory cell arrays or it could be multiple banks of nonvolatile memory cell arrays, depending on design variations. Data Register (130) processes and stores all necessary data transferring information. Command Register (110) and Address Register (120) process all command instructions and address information given through internal signals, 'd_lat[0:7]', according to an internal control signal 'csi_lat'. Input receiver logic (101) for CKI/CKI# is a differential type input buffer to handle the differential clock inputs, CKI & CKI#. Clock Doubler logic (109) doubles the clock frequency. Those two logics translate the external interface levels of CKI/CKI# signals to the internal logic levels of 'ick2', also referred to as a DDR-version clock signal. This internal clock signal may be used in other internal logic blocks for the various operations. In an embodiment of the present invention, the Clock Doubler (109) is employed to the derive 'ick2' signal which has two times of frequency compared to 'CKI' signal. This clock doubling logic (109) is well known technology; in one specific example (not shown) both 'CKI' and 'CKI#' signals' rising edges are used to generate two short pulses in one external clock cycle.

RCVR 102A is input receiver logic for a reset input RST# which provides hardware reset function for the memory device. When RST# is HIGH, the memory device is on the normal operating mode. When RST# is LOW, the device will enter the RESET mode.

RCVR 102B is input receiver logic for Chip Enable signal CE#. When CE# is LOW, the device is enabled. When CE# is HIGH, the device is disabled and enters into STANDBY mode. Once the device status becomes "BUSY", the CE# pin may be HIGH. In addition, CE# LOW activates and CE# HIGH deactivates the internal clock signals.

RCVR 102C is input receiver logic for receiving the CSI input and generating an internal signal 'csi_i'. This signal is connected to one of input ports of two-input NOR logic gate 104. This signal "csi_i" is also connected to a D port of D-type flip-flop logic gate 103A. The flip-flop 103A is driven by the DDR-version clock signal, 'ick2', and it latches the status of the 'csi_i' signal at every rising edge of 'ick2'. The latched signal 'csi_lat' is provided to the Command Register (110), Address Register (120), Data Register (130) and Device ID Register (140), and is also connected to MUX logic 106A. The output of the MUX logic 106A (cs2i) is connected to the D port of another flip-flop 103B. The output signal, 'cso_i' of flip-flop 103B, is finally driven to the input of an output driver block 108A which outputs the external signal, CSO. Two stages of flip-flop logic (103A & 103B) provide an input to output latency of 1 clock cycle for CSI to CSO latency.

RCVR 102D is input receiver logic for receiving the DSI input and generating an internal signal 'dsi_i'. This is connected to one of input ports of the two-input NOR logic gate 104. This signal "dsi_i" is also connected to a D input port of D-type flip-flop 103C. The flip-flop 103C is also driven by the DDR-version clock signal, 'ick2', and it latches the status of the 'dsi_i' signal at every rising edges of 'ick2'. The latched signal 'dsi_lat' is provided to the Data Register (130), and is also connected to MUX logic 106B. The output of the MUX logic 106B, dsi2, is connected to the D port of another flip-flop 103D. The output signal, 'dso_i' of flip-flop 103D, is finally driven to the input port of an output driver block 108C which outputs the external signal, DSO. Two stages of flip-flop logic (103C & 103D) provide an input to output latency of 1 clock cycle for DSI to DSO latency.

Another input receiver block, RCVR 102E, is for receiving an external signal D[0:7]. The notation of D[0:7] assumes an 8-bit wide input by way of specific example, but it can be any other number of bits. For example, if it is 4-bit wide, D[0:3] will be used instead of D[0:7]. Therefore, it is also noted that the quantity of the receiver 102E can be one or more than one according to the bit width. For example, if Dn ports are designated in D0, D1, ~D7, for an 8 bit wide I/O version, the receiver 102B will be a total of eight repeated blocks. The other blocks 103E, 106D, 106C, 103F and 108C introduced below are similarly repeated according to the bitwidth. The output of the receiver 102E, 'di[0:7]', is connected to a D port of D-type flip-flop 103E. The flip-flop 103E is also driven by the DDR-version clock signal, 'ick2', and it latches the status of the 'di[0:7]' signal bus at every rising edges of 'ick2'. The output of the flip-flop 103E, 'd_lat[0:7], is connected to the Command Register (110), Address Register (120), Data Register (130), Device ID Register (140) and to MUX logic 106D. The MUX logic 106D transfers 'rd[0:7]' when the device ID (Identification) in the Device ID register (140) matches to a device address byte (DA) of a certain Command and Write Data Packet (CWDP). A signal 'id_match' represents that kind of device ID matching status and it changes to HIGH logic state to show that the device ID is matched. If the device ID matching signal 'id_match' has logic LOW state, the MUX logic 106D will transfer 'd_lat[0:7]' to its output port. The output of the MUX logic 106D 'data[0:7]' is connected to '0' port of another MUX logic 106C, the output 'q2i[0:7]' of which is connected to another flip-flop 103F. The flip-flop 103F's output signal, 'qi[0:7]', is finally connected to the input of an output driver block 108B which outputs the external signal, Q[0:7]. Two stages of flip-flop logic (103E & 103F) provide an input to output latency of one full clock cycle for D[0:7] to Q[0:7] latency.

AND logic gate 105 is implemented to provide an AND function for signals, 'idle' and 'stat_en'. The signal 'idle' is an output from the two-input NOR logic 104, and the signal 'stat_en' is generated from Status Register (150). The 'stat_en' becomes HIGH logic state when the nonvolatile memory array (160) transitions to a 'READY' state from the 'BUSY' state if it was performing some operation initiated by the host controller. This 'stat_en' signal can be a short pulse which is long enough to be latched in latches 103B, 103D by the DDR clock signal 'ick2', or it can be two or more cycles long signal if the design requires more stable and informative 'Automatic Status Packet'. When the signal, 'stat_en', is HIGH logic and the signal, 'idle', is also HIGH logic, the AND logic gate 105 raises the state of s0 signal to HIGH logic. And the HIGH logic state of s0 switches all the outputs of the MUX logic gates (106A, 106B and 106C) to be coupled with the signals at the upper port '1' of the MUX logic gates (106A, 106B and 106C). The first MUX logic gate 106A's upper port is connected to a supply power VDD, for example, in order to make cs2$i$ signal to transit to HIGH logic state when the select signal, s0, is HIGH. Therefore, the CSO port can be HIGH logic for a period of one clock cycle if the status of the memory device changes to 'READY' from 'BUSY' and both CSI and DSI input states are idle (=LOW logic, for example). When the selection signal s0 is activated to HIGH logic for a certain period of time, the third MUX logic gate 106C also switches its input selection to the upper port '1', and then the output of the MUX logic 106C, q2$i$[0:7], receives a device address information through a signal called DA' (=Device Address). This signal DA should have the same device identification number which is generated and stored in the Device ID Register block 140. Then, the Q[0:7] ports will output the device address information when stat_en signal is active for making 'Automatic Status Packet'.

Figure 3:
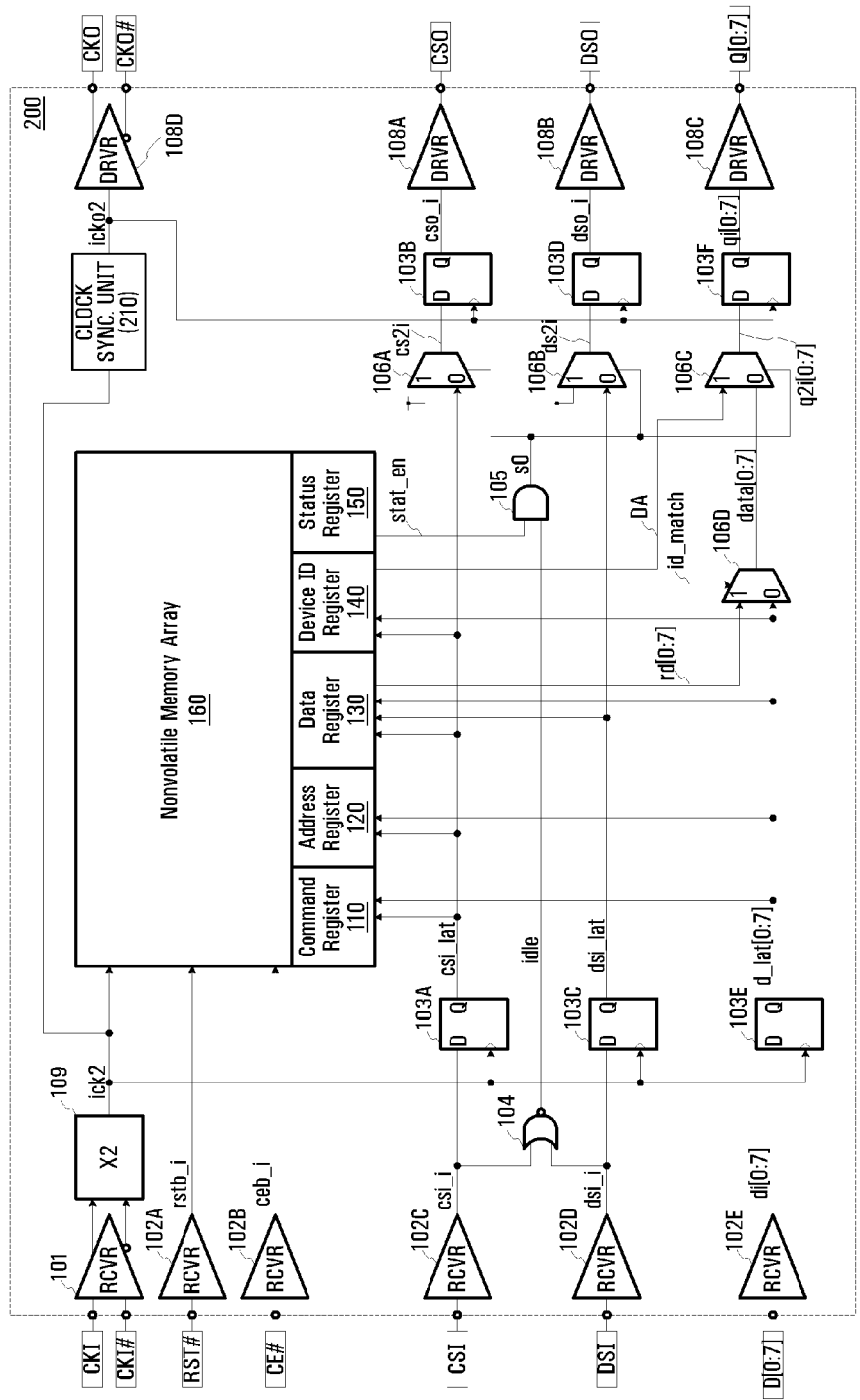
FIG. 3 illustrates another exemplary functional block diagram.

FIG. 3 depicts another exemplary functional block diagram for an embodiment of the present invention, this embodiment features a series connected clock signals scheme. This embodiment is appropriate for high speed operation. Shown is a Clock Synchronization Unit 210 which can, for example, be a PLL (Phase-Locked-Loop) or DLL (Delay-Locked-Loop) or DCC (Duty-Cycle-Corrector). All the other functional operations are same as the first embodiment in FIG. 1 except the additional output driver logic gate 108D and the Clock Synchronization Unit 210. The output of the Clock Synchronization Unit 210 is called 'icko2' and is used to drive the clock ports of the three D-flip-flops, 103B, 103D and 103F. This clocking scheme provides better phase matching between CKO/CKO# clock signals and the three output signals, CSO, DSO and Q[0:7].

Figure 4:
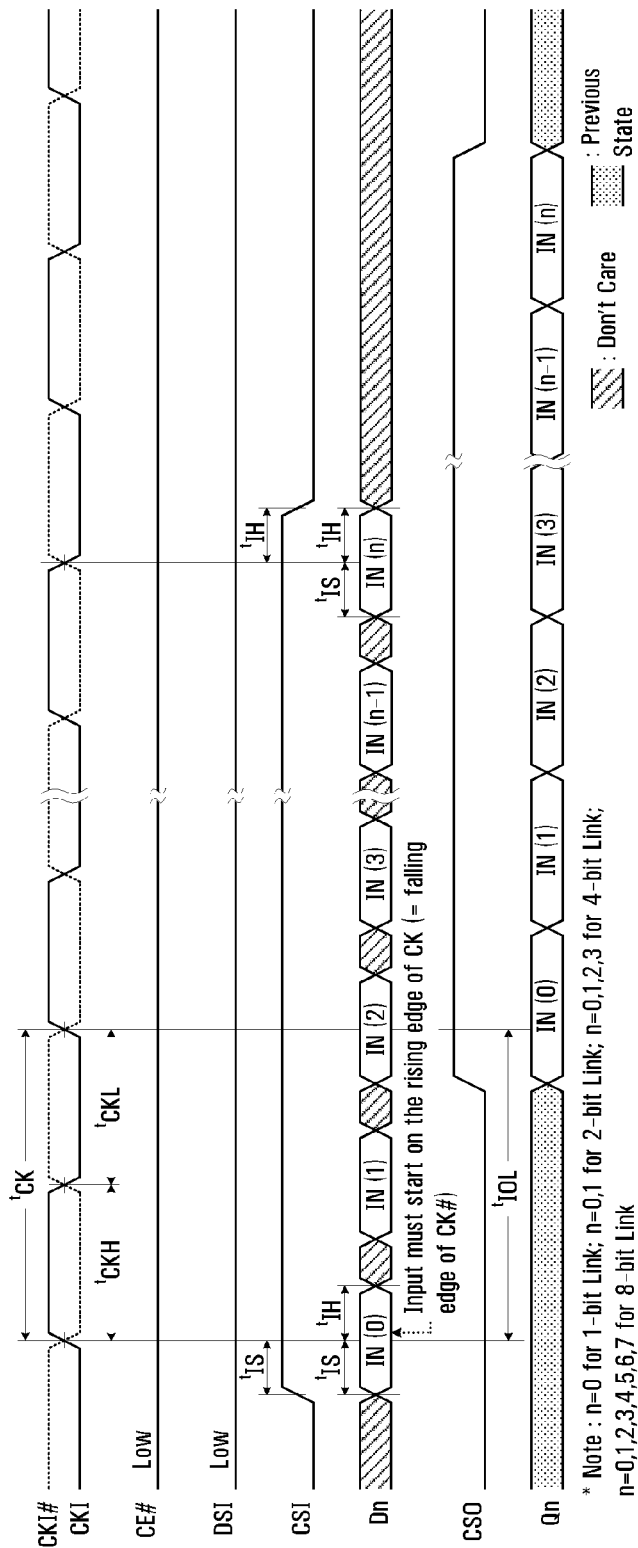
FIG. 4 illustrates a timing diagram of command and write data packet.

FIG. 4 depicts a timing diagram of a Command and Write Data Packet (CWDP). The timing is described, for example, in the context of the proposed device specification (Hyper-Link NAND Flash Specification). The CSI strobe signal delineates the length of the CWDP. The input bytes on the Dn ports can be received by the input receiver 102E and be latched by flip-flop 103E at the rising and/or falling edges of the internal clock signal, ick2. The HLNAND specification requires input setup time tIS and input hold time tIH as shown in FIG. 4. The echo output signal CSO and Qn will be delayed by one clock cycle and it is defined as Input-to-Output Latency, tIOL. This echoing function for the CWDP makes the host controller have effective system operation because the controller will be able to check whether the issued CWDP is properly transferred through out the ring when it compares the returning echo signals of CWDP with its stored original CWDP information. If the controller finds there is any discrepancy between its original CWDP and returned CWDP, the host controller may have to reissue the same CWDP. When CWDP contains Write Data bytes which may be very numerous (4 Kbytes~16 Kbytes in NAND flash devices), the Write Data bytes can be truncated in order to reduce power consumption. Device Address byte, Command byte and Address bytes, however, should be always bypassed through their corresponding output ports.

Figure 5:
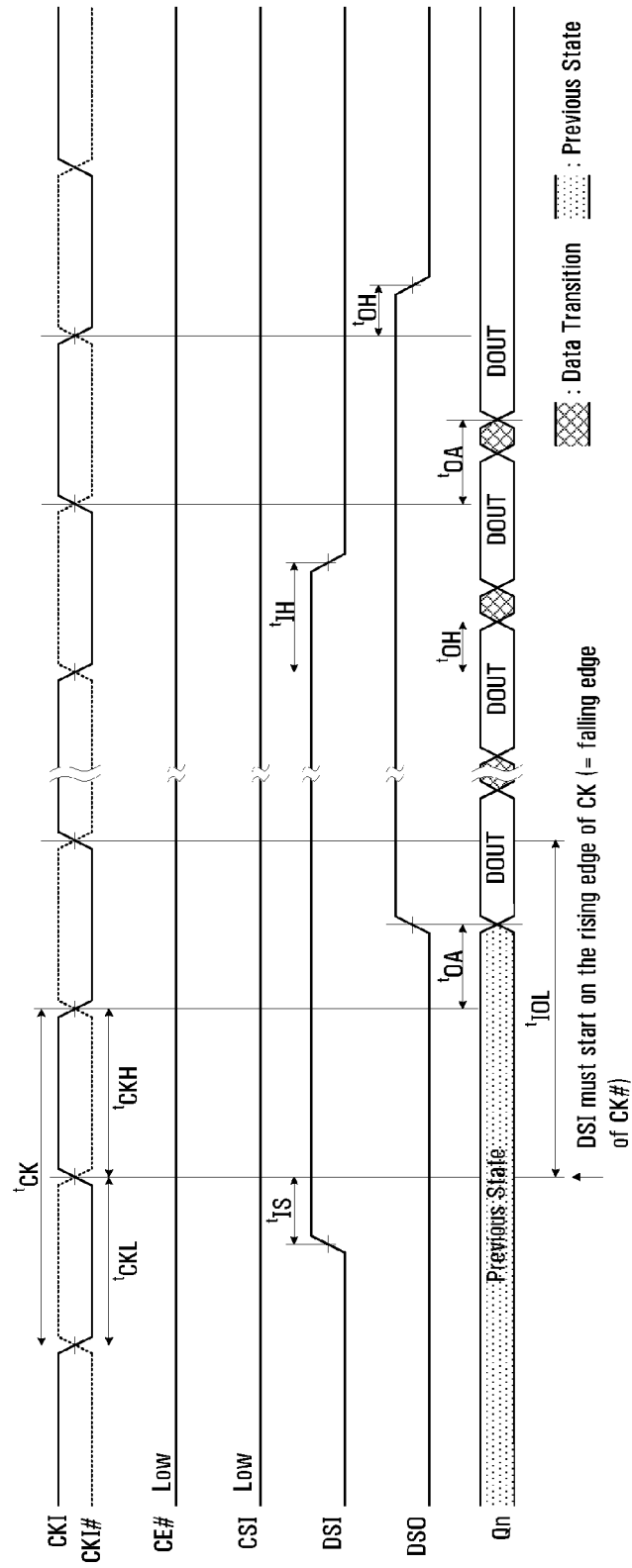
FIG. 5 illustrates a timing diagram of read data packet.

FIG. 5 depicts a timing diagram of a Read Data Packet (RDP). The DSI input delineates the length of the RDP, and its echo output port DSO delayed by tIOL the same as CSO shown in FIG. 4. Qn output bus also has the same latency as tIOL. The output access time is tOA and the output hold time is tOH.

Figure 6:
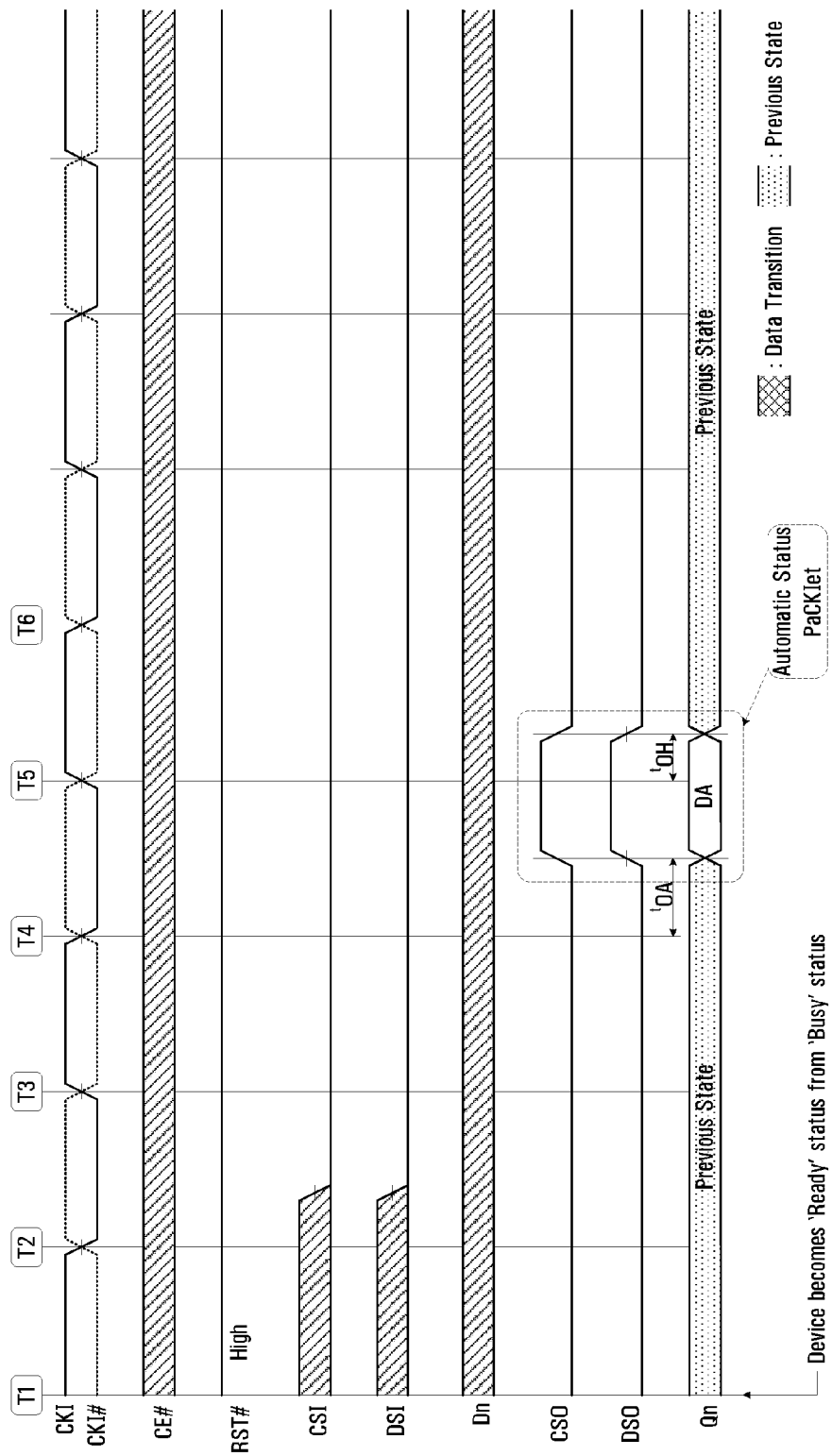
FIG. 6 illustrates a timing diagram of automatic status packet.

FIG. 6 shows one embodiment of the present invention with regarding to a timing diagram of Automatic Status Packet (ASP). When a nonvolatile memory device changes its 'BUSY' status to 'READY' status after it has finished its given operation at time T1, as shown in FIG. 6, the Status Register 150 activates the signal 'stat_en' for a certain period of time (=one-half clock cycle, for example), and the memory device checks to see if both CSI and DSI are in idle state through the AND logic gate 105. If one of CSI or DSI is not in LOW logic state as shown at T2, for example, the output of AND logic 105 's0' won't go HIGH logic, so that the MUX logic 106A still transfers 'csi_lat' signal to its output 'cs2$i$'. And then, the Status Register 150 may have to regenerate 'stat_en' pulse again because its ASP operation is not completed. A logic circuit (not shown) may be provided to allow status register 150 to know whether the automatic status packet was successfully transmitted or not. And this time, at T4, both 'stat_en' signal and 'idle' signal are HIGH, then the signal 's0' becomes HIGH logic state, so that it enables all the upper port (1) of the three MUX logic gates (106A, 106B and 106C). Therefore 'cs2$i$', 'ds2$i$' and q2$i$[0:7] will have HIGH logic state and Device Address (DA) information at the time T5 as shown FIG. 6. This one-half clock cycle long packet is defined as Automatic Status Packet (ASP) and it will be flowing downstream of the ring heading to the host controller. Once the host controller receives this ASP, it will recognize which device has become 'READY' state by decoding the DA byte in the ASP. In the other simpler embodiment, this DA byte could be omitted, and only CSO and DSO activation can be implemented in order to indicate there is a device which has become 'READY' state. And in this case, the host controller may need to send either broadcast status read command to all the memory devices in the ring or send normal read status command to specific device(s) which were requested for some operation before.

Figure 7:
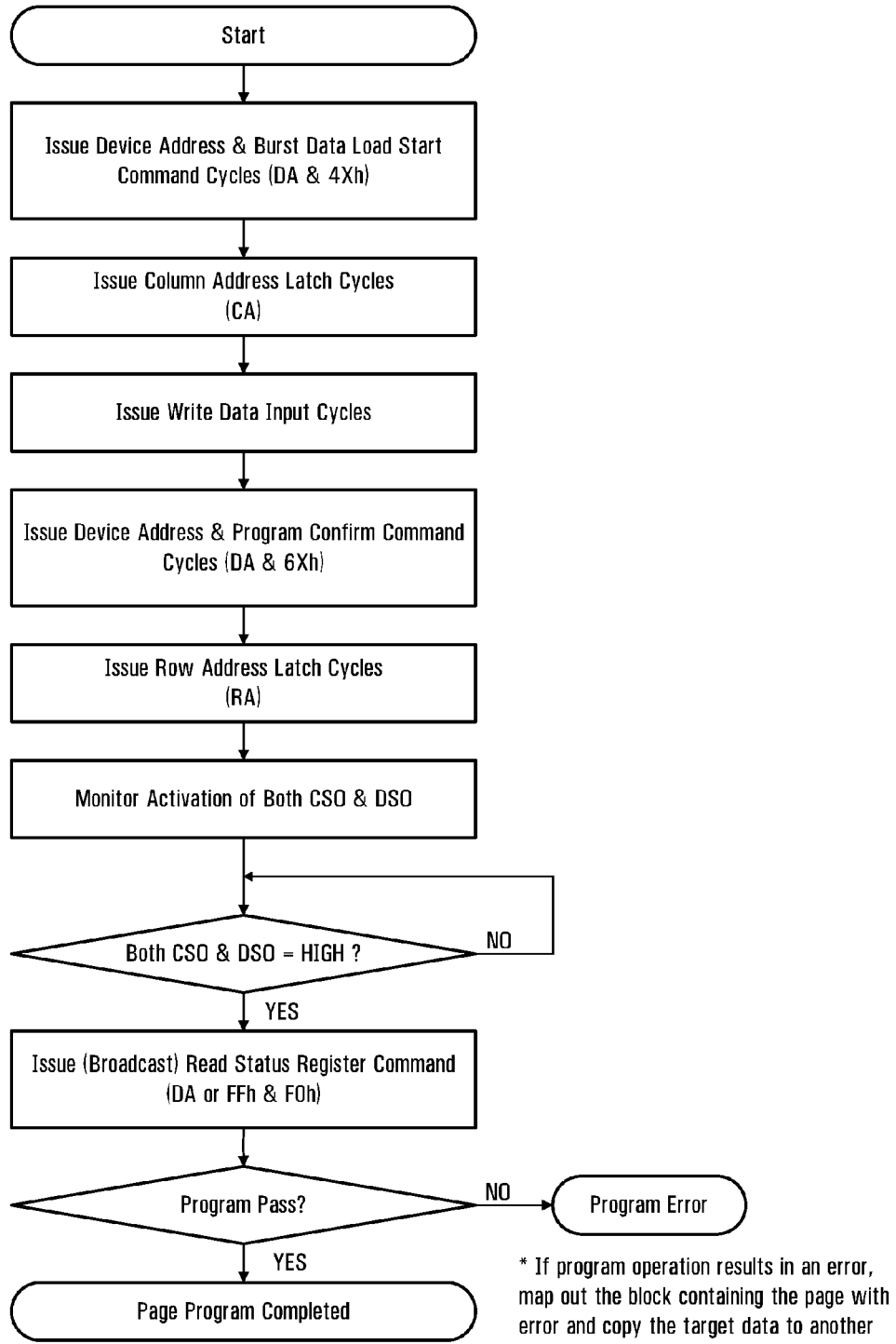
FIG. 7 illustrates an exemplary flow chart for page program operation.
Figure 8:
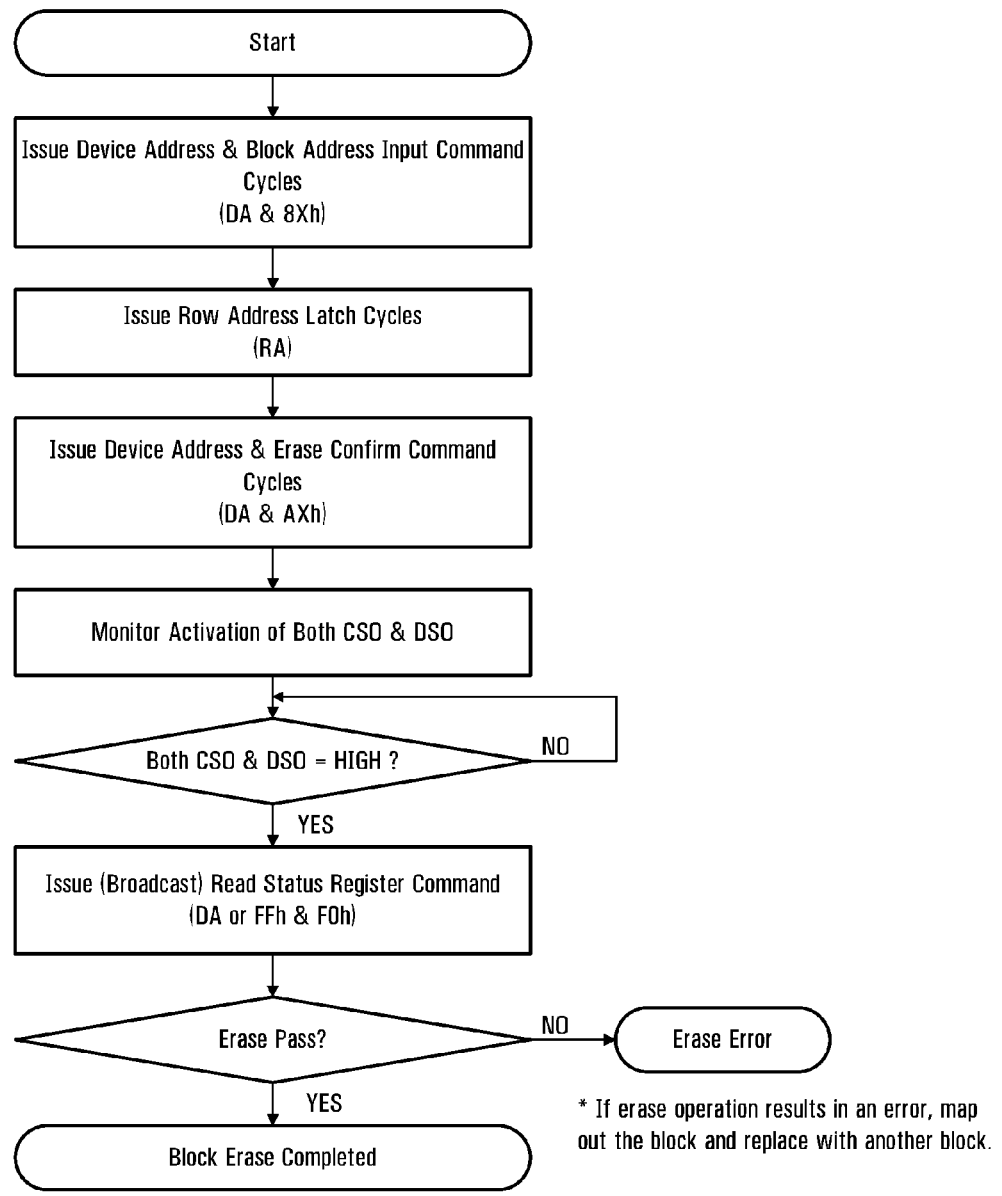
FIG. 8 illustrates an exemplary flow chart for block erase operation.

FIG. 7 and FIG. 8 show exemplary flow charts for page program operation and block erase operation, respectively. Those two operations are shown as examples. Because those two operations require quite a long time to be finished and it is hard to predict when the operations will be completed as every NAND flash cell conditions may be different. Therefore the host controller usually sends down read status command periodically to check the status. It can be a significant burden for the system controller design because the status polling operation can easily reduces the overall read or write throughput.

Figure 9:
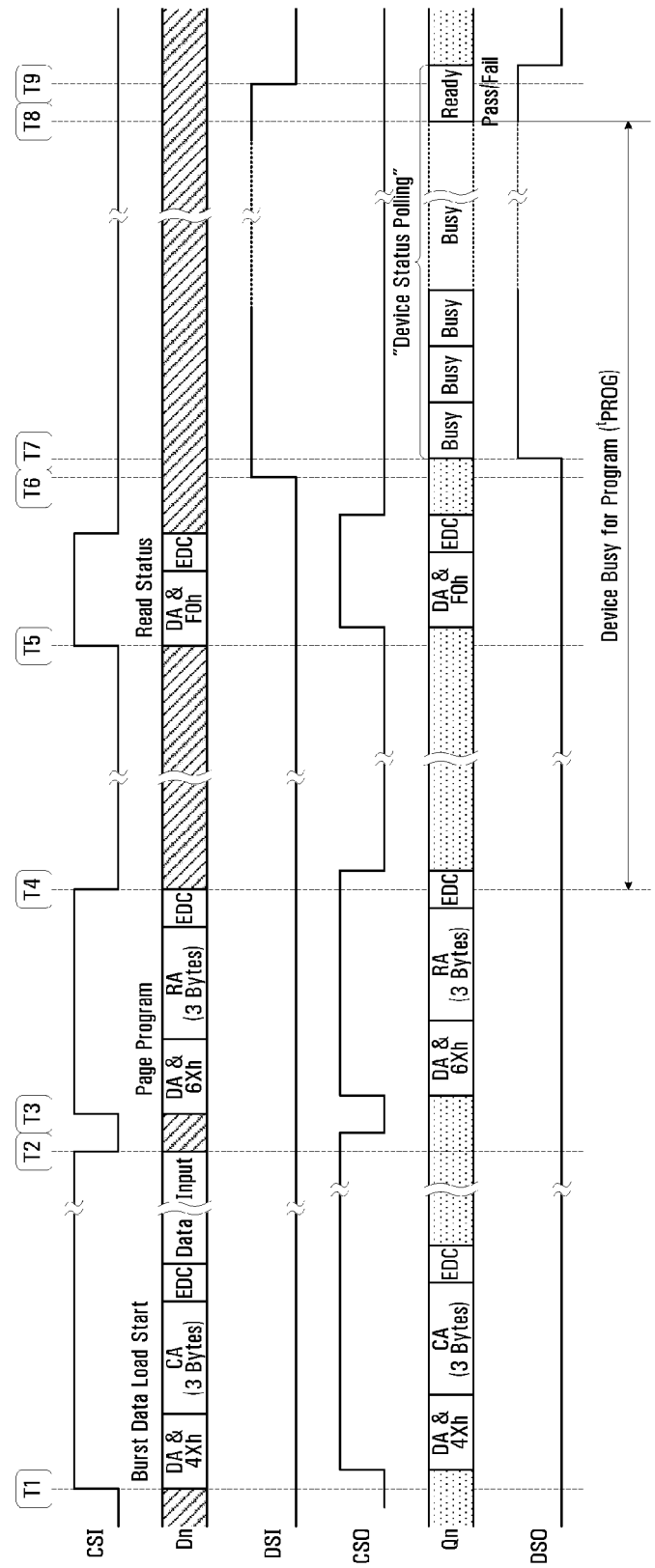
FIG. 9 illustrates a timing diagram of page program operation.

FIG. 9 illustrates a timing diagram of an example 'page program operation'. As shown in FIG. 9, in between time T7 and T9, the host controller may have to check the status continuously. Otherwise the host controller must wait for the maximum page program time specified in the data sheet. This maximum time is longer than the normal page program time because the manufacturer has to cover all the worst conditions for the program performance and each memory cell condition is different from each other as the memory device usage time elapses.

Figure 10:
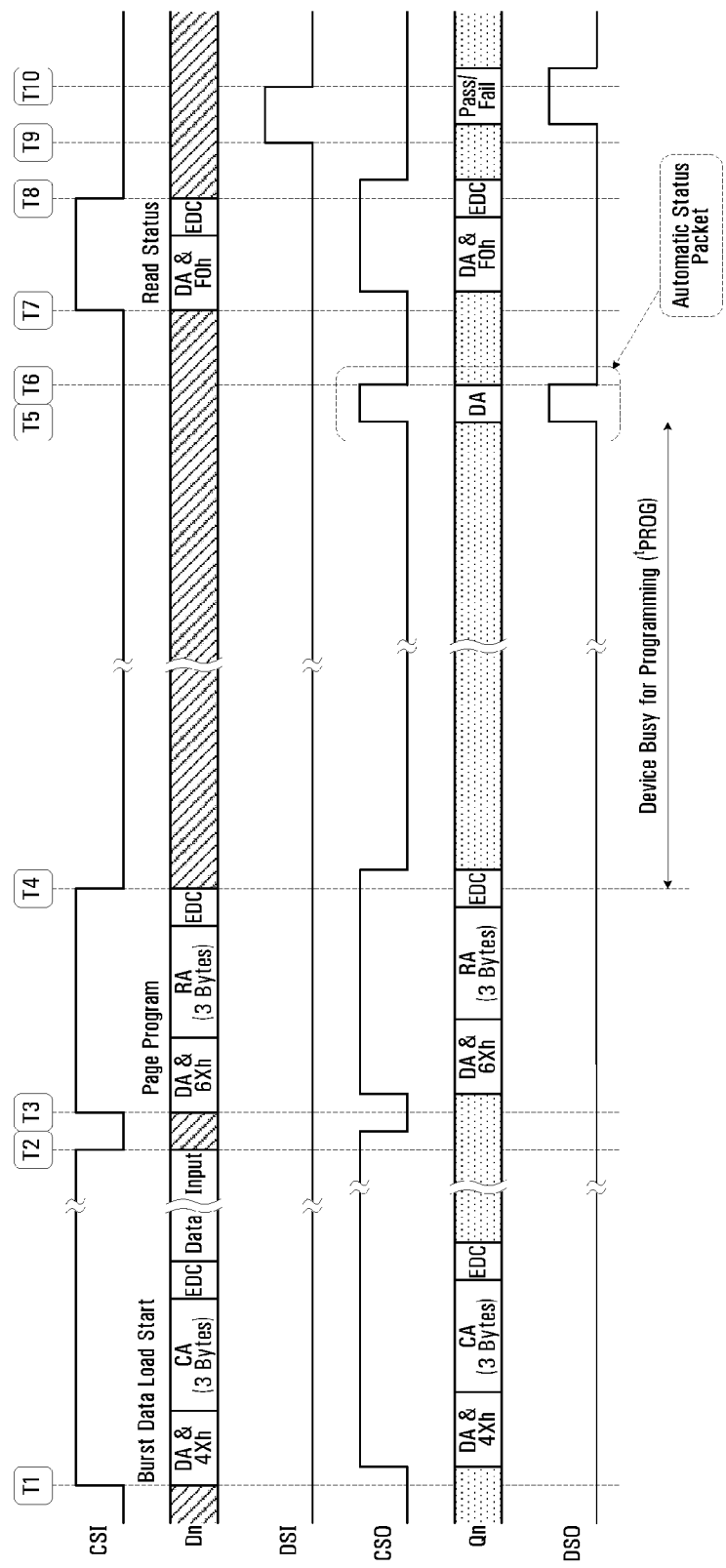
FIG. 10 illustrates a timing diagram of page program operation.

FIG. 10 illustrates a Timing Diagram of 'Page Program Operation' in accordance with an embodiment of the invention. FIG. 10 is similar to FIG. 9, but instead of the controller performing device status polling as per FIG. 9, an automatic status packet is generated.

FIG. 10 shows the benefit of ASP implementation for the page program operation. The host controller can easily recognize when the page program operation has been completed by receiving both HIGH logic states on CSO and DSO signals, and it also can detect which device has been completed by accessing DA information in the ASP. Additional status checking operation may be required for checking PASS/FAIL result from the memory device.

Figure 11:
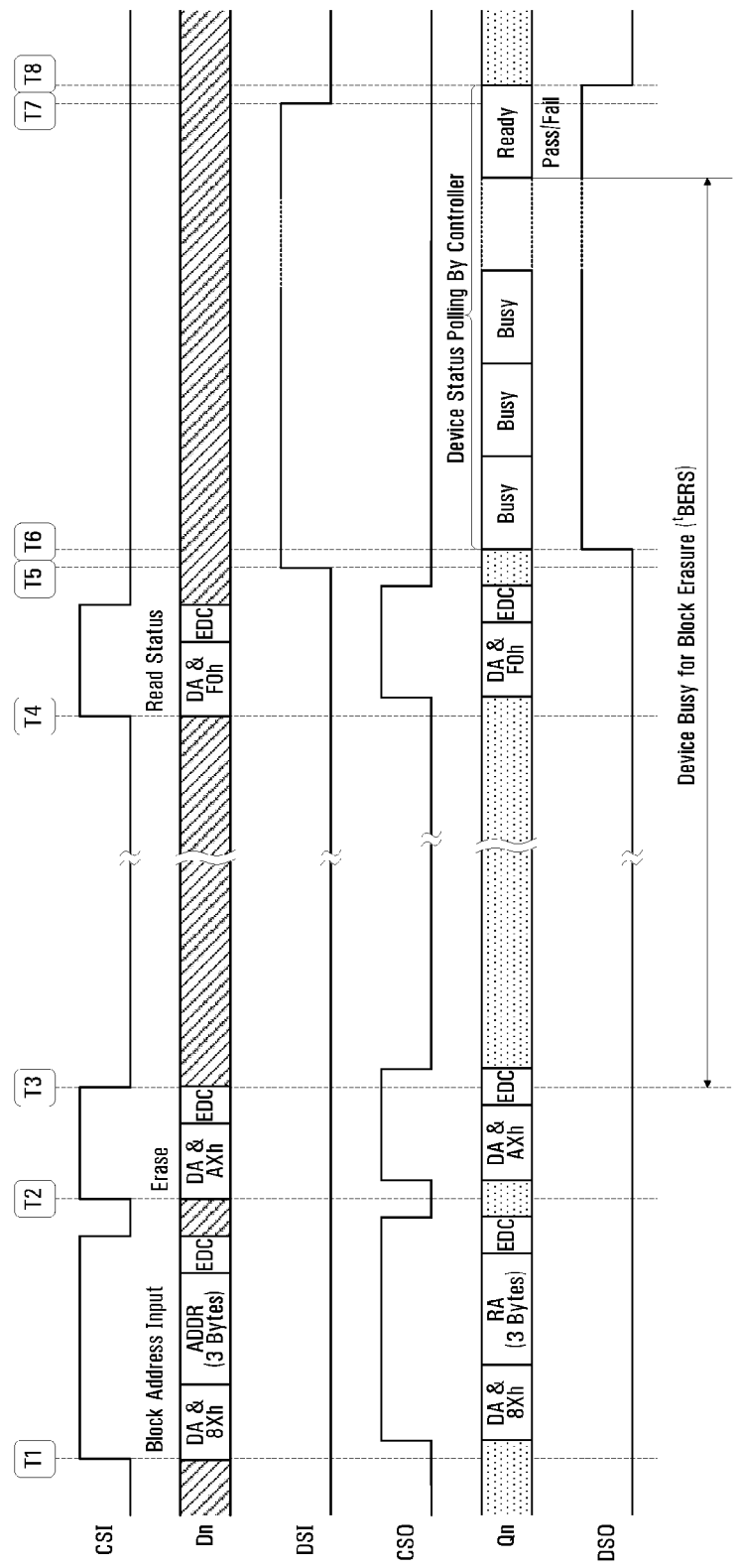
FIG. 11 illustrates a timing diagram of block erase operation.

FIG. 11 shows a timing diagram of an example block erase operation which is showing continuous status polling period between T6 and T8.

Figure 12:
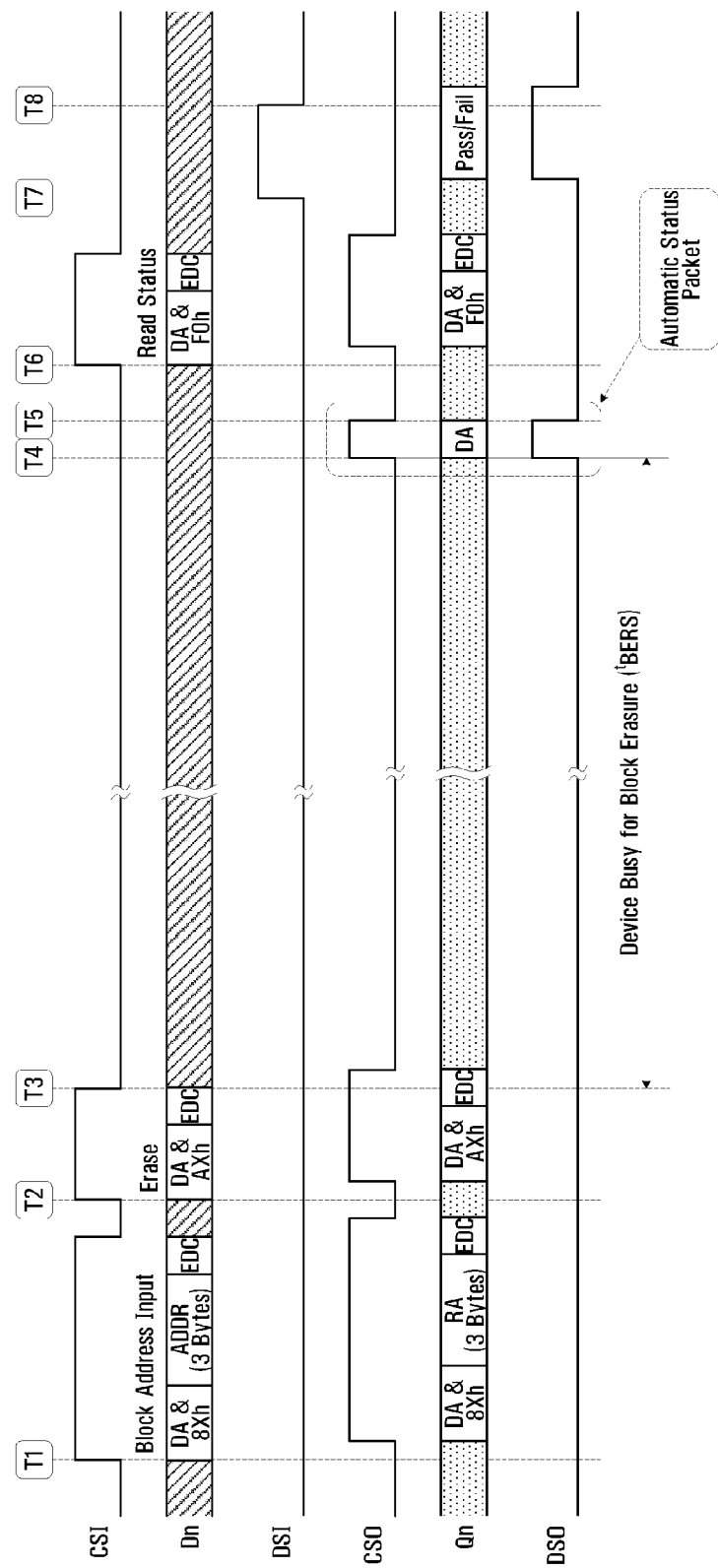
FIG. 12 illustrates a timing diagram of block erase operation.

FIG. 12 shows the case of block erase operation as similar to page program operation, in accordance with an embodiment of the invention. FIG. 12 is similar to FIG. 11, but instead of the controller performing device polling as per FIG. 11, an automatic status packet is generated.

Figure 13:
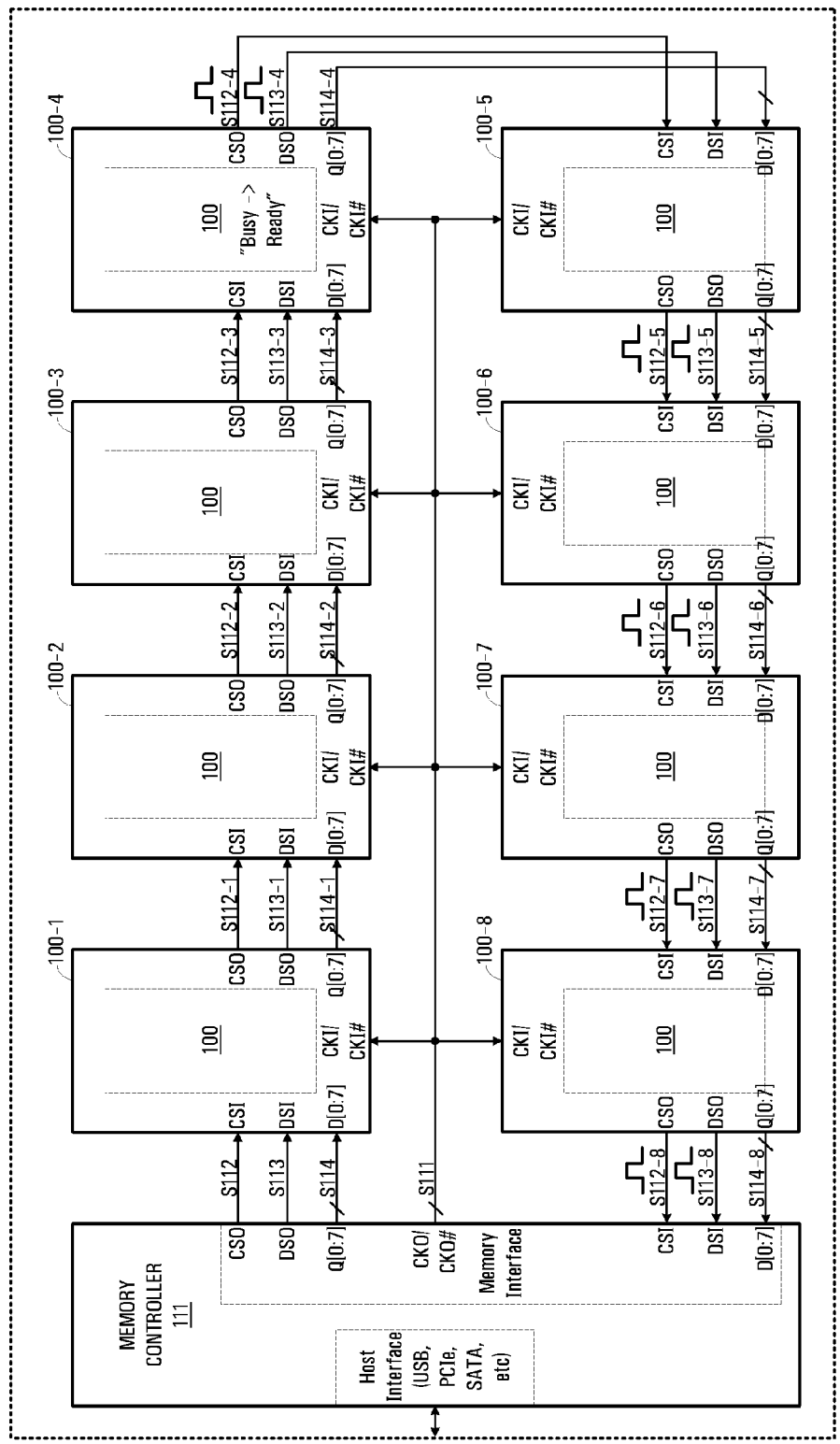
FIG. 13 illustrates a system block diagram having automatic status packet)
Figure 14:
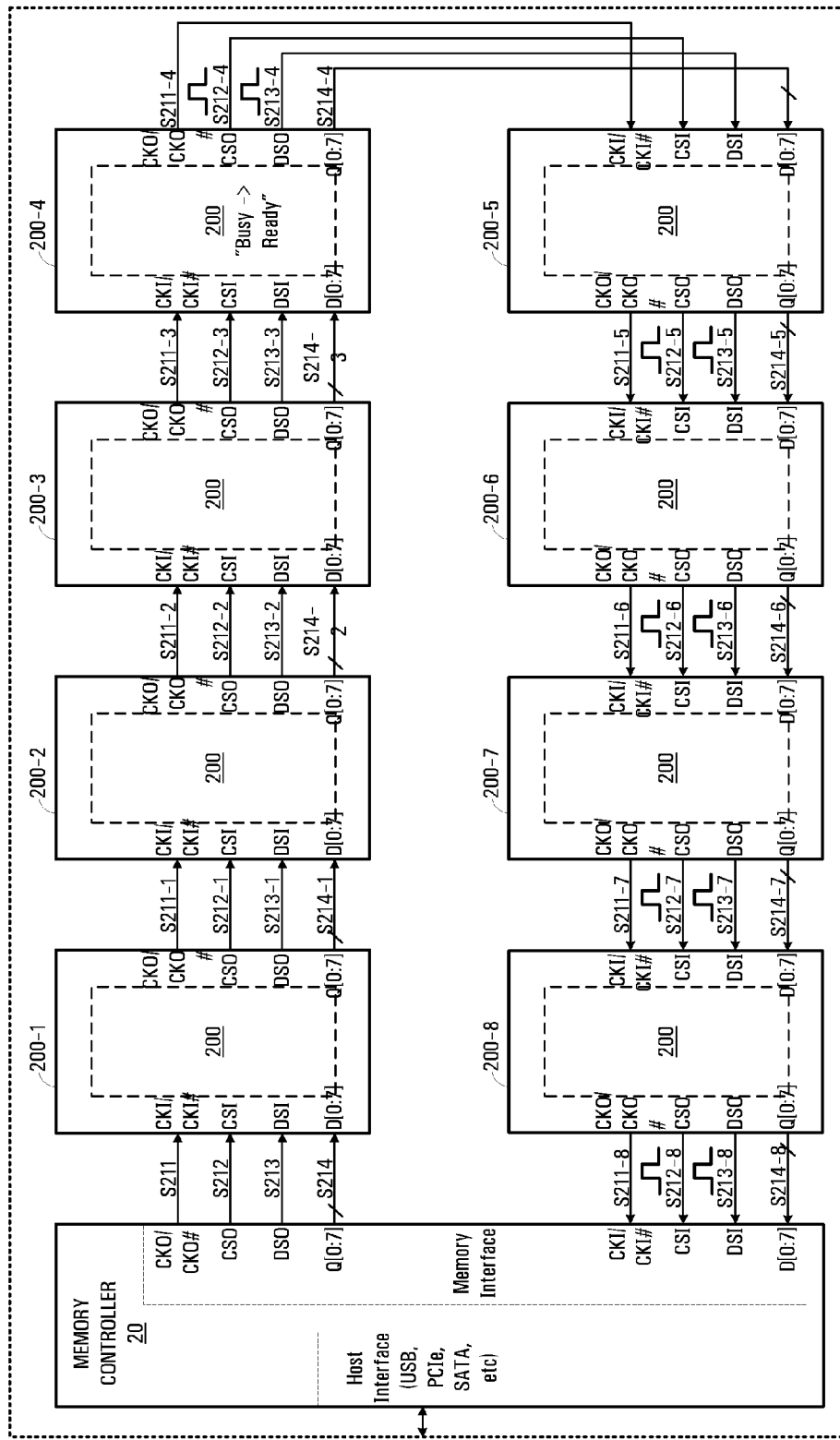
FIG. 14 illustrates another system block diagram having automatic status packet.

FIG. 13 and FIG. 14 show the exemplary system block diagrams based on the Automatic Status Packet scheme. A set of memory devices 100-1, 100-2, . . . , 100-8 are serially interconnected in a ring configuration to memory controller 111. CSO signals are depicted as S112, S112-1, . . . , S112-8; DSO signals are depicted as DSO S113, S113-1, . . . , S113-8; data signals are depicted as S114, S114-1, . . . , S114-8.

In the embodiment of FIG. 13, a clock signal S111 is commonly connected to all of the memory devices. A set of memory devices 200-1, 200-2, . . . , 200-8 are serially interconnected in a ring configuration to memory controller 111. CSO signals are depicted as S212, S212-1, . . . , S212-8; DSO signals are depicted as DSO S213, S213-1, . . . , S213-8; data signals are depicted as S214, S214-1, . . . , S214-8. The embodiment of FIG. 14 also features clock signals CKO/CKO# propagated along the ring as indicated at S211, S211-1, . . . , S211-8. In these examples, memory device 100-4 has been selected for the certain operation which is requiring long time to finish, and when it is ready, it will output CSO and DSO with HIGH logic for a half-clock period along with DA information on Q[0:7] ports. This packet will be travelling downstream of the ring and will be reached at the host controller. Therefore, once the host controller receives the ASP, it can send PASS/FAIL checking status read command to the device 100-4.

In some embodiments, only CSO and DSO are used to indicate 'automatic status packet' without information byte(s) on the Qn ports.

In some embodiments, the length of the 'automatic status packet' can be any number of clock cycles, even in ½ cycles or ¼ cycle as long as the whole interconnection system can flow through the packet back to the host controller.

In some embodiments, DDR (Double-Data-Rate) or QDR (Quad-Data-Rate) clocking may be used with embodiments of the present invention.

In some embodiments, single ended (=CKI only) or differential (=CKUCKI#) clocking scheme may be used with embodiments of the present invention.

In some embodiments, different types of memory devices can be utilized as along as they have compatible interfaces.

In some embodiments, the memory system is implemented in a single package (MCP) including a plurality of memory devices and one or more controller chips stacked inside the package.

In some embodiments, multiple interconnection rings are implemented.

In some embodiments, it is noted that all hex codes for the command and address packets and mode register values may be different from the example of the present invention.

In some embodiments, DSI/CSI signals may be low activation (=logic-low period indicates valid packet, instead of logic-high activation as shown in this disclosure examples).

In some embodiments, clock and all other signals may be "edge aligned", instead of "center aligned" as shown in the examples.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of devices and apparatus. Thus, in actual configuration, the circuit elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory device comprising:
a non-volatile memory array;
a data output port configured to output data read from the memory array;
a status maintainer configured to maintain status information identifying a status of the memory device;
a status transmitter configured to, responsive to a change in the status information, transmit a status signal using at least the data output port;
a first receiver configured to receive for receiving a first input signal;
a second receiver configured to receive for receiving a second input signal;
a first transmitter configured to transmit for transmitting a first output signal;
a second transmitter configured to transmit for transmitting a second output signal,
a command input being indicated by the first input signal asserted and the second input signal de-asserted,
a data input being indicated by the first input signal de-asserted and the second input signal asserted; and
an echo generator configured to cause the first output signal to be asserted after the first input signal is asserted, and cause the second output signal to be asserted after the second input signal is asserted,
the status transmitter, responsive to a change in the status information, transmitting the status signal using at least the data output port by:
transmitting the status information on the data output port;
causing the first output signal and the second output signal to be simultaneously asserted.

2. The memory device of claim 1 further comprising at least one other output port;
wherein the status signal that uses at least the data output port comprises a byte transmitted on the data output port, together with at least one indicator on the at least one other output port that indicates the byte being output on the data output port is a status byte.

3. The memory device of claim 1 wherein the status maintainer maintains status information that identifies whether the memory device is ready or busy, and wherein the status transmitter transmits the status information responsive to at least one of a change in status from busy to ready and a change in status from ready to busy.

4. The memory device of claim 1 wherein the memory device is one of a plurality of memory devices that are interconnected in series.

5. The memory device of claim 1 further comprising:
a status transmitter enabler that enables the status transmitter to transmit the status signal only when neither the first input signal nor the second input signal is being asserted.

6. The memory device of claim 1 wherein the device outputs a device ID as part of the status signal.

7. The memory device of claim 1 for use in an arrangement of serially interconnected like devices.

8. An apparatus comprising:
a plurality of memory devices in accordance with claim 1 in a serially interconnected arrangement including at least a first memory device and a last memory device;
a memory controller connected to the first and last of the plurality of memory device.

9. An apparatus comprising:
a memory controller;
a plurality of memory devices in accordance with claim 1 connected to the memory controller in a multi-drop configuration.

10. A memory device comprising:
a non-volatile memory array;
a data output port configured to output data read from the memory array;
a status maintainer configured to maintain status information identifying a status of the memory device;
a status transmitter configured to, responsive to a change in the status information, transmits a status signal;
a first receiver configured to receive a first input signal;
a second receiver configured to receive a second input signal;
a first transmitter configured to transmit a first output signal and a second transmitter configured for transmitting a second output signal;
wherein a command input is indicated by the first input signal being asserted and the second input signal being de-asserted;
wherein a data input is indicated by the first input signal being de-asserted and the second input signal being asserted;
the memory device further comprising an echo generator configured to cause the first output signal to be asserted after the first input signal is asserted, and causes the second output signal to be asserted after the second input signal is asserted;
wherein the status transmitter, responsive to a change in the status information, transmits the status signal by causing the first output signal and the second output signal to be simultaneously asserted.

11. A method comprising:
outputting data read from a memory array of a memory device through a data output port;
maintaining status information identifying a status of the memory device;
responsive to a change in the status information, transmitting a status signal using at least the data output port;
receiving a first input signal;
receiving a second input signal;
transmitting a first output signal and transmitting a second output signal;
a command input being indicated by the first input signal being asserted and the second input signal being de-asserted,
a data input being indicated by the first input signal being de-asserted and the second input signal being asserted;
causing the first output signal to be asserted after the first input signal is asserted; and
causing the second output signal to be asserted after the second input signal is asserted; and
responsive to a change in the status information, transmitting a status signal using at least the data output port, the transmitting comprising:
transmitting the status information on the data output port; and
causing the first output signal and the second output signal to be simultaneously asserted.

12. The method of claim 11 wherein transmitting the status signal comprises::
transmitting a byte on the data output port;
transmitting at least one indicator on at least one other output port configured to indicate the byte being output on the data output port is a status byte.

13. The memory device of claim 11 wherein the status information identifies whether the memory device is ready or busy, and transmitting the status information is responsive to at least one of a change in status from busy to ready and a change in status from ready to busy.

14. The method of claim 11 further comprising:
enabling the transmission of the status signal only when neither the first input signal nor the second input signal is being asserted.

15. The method of claim 11 further comprising:
outputting a device ID as part of the status signal.

16. The method of claim 11 for use in an arrangement of serially interconnected like devices.

17. The method of claim 11 for use in an arrangement of like memory devices connected to a memory controller in a multi-drop configuration.

18. A method comprising:
outputting data read from a memory array of a memory device through a data output port;
maintaining status information identifying a status of the memory device;
receiving a first input signal;
receiving a second input signal;
transmitting a first output signal and a transmitting a second output signal;
wherein a command input is indicated by the first input signal being asserted and the second input signal being de-asserted;
wherein a data input is indicated by the first input signal being de-asserted and the second input signal being asserted;
the method further comprising:
causing the first output signal to be asserted after the first input signal is asserted, and causing the second output signal to be asserted after the second input signal is asserted; responsive to a change in the status information, transmitting a status signal by causing the first output signal and the second output signal to be simultaneously asserted.

* * * * *